United States Patent
Womac et al.

(10) Patent No.: US 12,316,225 B2
(45) Date of Patent: May 27, 2025

(54) BLOCKING AND STARTUP TRANSISTOR CONTROL IN VOLTAGE CONVERTERS

(71) Applicant: Texas Instruments Incorporated, Dallas, TX (US)

(72) Inventors: Austin Womac, Maryville, TN (US); Ryan Lind, Knoxville, TN (US); Richard Stair, Knoxville, TN (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 234 days.

(21) Appl. No.: 17/956,351

(22) Filed: Sep. 29, 2022

(65) Prior Publication Data

US 2023/0120432 A1    Apr. 20, 2023

Related U.S. Application Data

(60) Provisional application No. 63/272,311, filed on Oct. 27, 2021, provisional application No. 63/257,505, filed on Oct. 19, 2021.

(51) Int. Cl.
*H02J 7/00* (2006.01)
*G05F 1/59* (2006.01)
(Continued)

(52) U.S. Cl.
CPC .......... *H02M 3/1582* (2013.01); *G05F 1/59* (2013.01); *H02J 7/007* (2013.01); *H02M 1/32* (2013.01);
(Continued)

(58) Field of Classification Search
CPC ............... H02M 3/1582; H02J 7/007; H03K 17/08104; H03K 17/687; H03K 19/20
See application file for complete search history.

(56) References Cited

U.S. PATENT DOCUMENTS 9,136,724 B2    9/2015   Ye et al.
10,177,420 B2 *  1/2019   Huang ............... H02M 3/1588
(Continued)

FOREIGN PATENT DOCUMENTS

CN    110677960 A  *  1/2020
CN    111049382 A  *  4/2020   ............. H02M 1/08
(Continued)

OTHER PUBLICATIONS

"bq2419x I2C Controlled 4.5-A Single Cell USB/Adapter Charger with Narrow VDC Power Path Management and USB OTG," Datasheet SLUSAW5B (Texas Instruments Incorporated, 2014).
(Continued)

*Primary Examiner* — Sisay G Tiku
(74) *Attorney, Agent, or Firm* — Charles F. Koch; Frank D. Cimino

(57) ABSTRACT

In a voltage converter, a blocking transistor has a conduction path between a power terminal and a converter terminal. A body diode of the blocking transistor: conducts current from the power terminal to the converter terminal; and blocks current from the converter terminal to the power terminal. A first switching transistor has a conduction path between the converter terminal and a switching terminal. A second switching transistor has a conduction path between the switching terminal and a ground terminal. A first gate driver has an output coupled to a control terminal of the first switching transistor. A second gate driver has an output coupled to a control terminal of the second switching transistor. A driver circuit has an output coupled to a control terminal of the blocking transistor. A bootstrap terminal of the driver circuit is coupled to a bias input of the first gate driver.

28 Claims, 12 Drawing Sheets

(51) Int. Cl.
  *H02M 1/32* (2007.01)
  *H02M 3/158* (2006.01)
  *H03K 17/081* (2006.01)
  *H03K 17/687* (2006.01)
  *H03K 19/20* (2006.01)

(52) U.S. Cl.
  CPC ..... *H03K 17/08104* (2013.01); *H03K 17/687* (2013.01); *H03K 19/20* (2013.01)

(56) References Cited

U.S. PATENT DOCUMENTS

| | | | | |
|---|---|---|---|---|
| 10,778,099 | B1* | 9/2020 | Womac | H02M 1/32 |
| 11,088,559 | B2 | 8/2021 | Nandimandalam Venkata et al. | |
| 11,159,032 | B2* | 10/2021 | Womac | H02M 7/48 |
| 11,522,458 | B2* | 12/2022 | Vispute | H02M 3/1582 |
| 2007/0268729 | A1* | 11/2007 | Choi | H02M 3/33571 |
| | | | | 363/132 |
| 2010/0002472 | A1* | 1/2010 | Brohlin | H02M 3/158 |
| | | | | 363/21.1 |
| 2012/0139345 | A1 | 6/2012 | Ye et al. | |
| 2014/0002049 | A1* | 1/2014 | Schrom | H02M 3/1588 |
| | | | | 323/311 |
| 2015/0061611 | A1* | 3/2015 | Li | H02M 3/1588 |
| | | | | 323/235 |
| 2019/0305568 | A1* | 10/2019 | Hand | H02J 7/0068 |
| 2021/0013808 | A1* | 1/2021 | Cattani | H02M 1/0006 |
| 2021/0126538 | A1* | 4/2021 | Puia | H02M 3/158 |
| 2022/0006450 | A1* | 1/2022 | Fontana | H02M 1/08 |
| 2023/0040189 | A1* | 2/2023 | Fontana | H03K 19/00315 |
| 2023/0068627 | A1* | 3/2023 | Sharifi | H03K 17/687 |
| 2023/0208288 | A1* | 6/2023 | Liang | H02M 1/0025 |
| | | | | 323/272 |
| 2023/0353049 | A1* | 11/2023 | Zhang | H02M 1/088 |
| 2024/0146198 | A1* | 5/2024 | Lu | B60L 50/60 |
| 2024/0178749 | A1* | 5/2024 | Cheng | H02M 3/158 |

FOREIGN PATENT DOCUMENTS

| | | | | |
|---|---|---|---|---|
| CN | 114402498 | A * | 4/2022 | H02M 1/143 |
| CN | 216595952 | U * | 5/2022 | |
| WO | WO-2021016157 | A1 * | 1/2021 | H02M 1/143 |

OTHER PUBLICATIONS

"BQ25618/619 I2C Controlled 1-Cell 1.5-A Battery Charger with 20-mA Termination and 1-A Boost Operation," Datasheet SLUSDF8D (Texas Instruments Incorporated, Dec. 2021).

"Hiccup Mode Current Limiting," LinFinity Application Note AN-8, Rev. 0.1 (LinFinity Microelectronics, 1998).

Li et al., "An Improved Hiccup Mode Short-Circuit Protection Technique With Effective Overshoot Suppression for DC-DC Converters," Trans. Power Elec., vol. 28, No. 2 (IEEE, 2013), pp. 877-885.

Moon et al., "60-V Non-Inverting Four-Mode Buck—Boost Converter With Bootstrap Sharing for Non-Switching Power Transistors," Access, vol. 8 (IEEE, 2020), pp. 208221-208231.

Sahu et al., "A low voltage, dynamic, noninverting, synchronous buck-boost converter for portable applications," Trans. Power Elec., vol. 19, No. 2 (IEEE, 2004), pp. 443-452.

Seidel et al., "Bootstrap circuit with high-voltage charge storing for area efficient gate drivers in power management systems," ESSCIRC 2014—40th European Solid State Circuits Conference (IEEE, 2014), pp. 159-162.

Wong, "Dynamic power management for faster, more efficient battery charging," Analog Applications Journal (Texas Instruments Incorporated, 4Q 2013), pp. 15-18.

* cited by examiner

BLOCKING AND STARTUP TRANSISTOR CONTROL IN VOLTAGE CONVERTERS

CROSS-REFERENCE TO RELATED APPLICATIONS

This application claims the benefit of and priority to: U.S. Provisional Patent Application No. 63/257,505 filed Oct. 19, 2021; and U.S. Provisional Patent Application No. 63/272, 311 filed Oct. 27, 2021, both of which applications are hereby fully incorporated herein by this reference.

BACKGROUND

This relates generally to voltage converter circuits, and more particularly to control of blocking and startup transistors in such voltage converter circuits.

Rechargeable batteries (e.g., lithium-ion batteries) are widely used in portable and mobile electronic systems, such as smartphone, tablet, notebook and laptop computing devices. These electronic systems typically include a processor such as a microprocessor, memory, communications modules, and other functions, each of which consume operating power from the battery. To recharge the system battery, an external power source (such as an external charger) is coupled to the system through a Universal Serial Bus (USB) or other interface. A charging circuit internal to the system controls the application of power from the external power source to charge the battery.

One example of such a charging circuit in lithium-ion battery-powered systems is a synchronous switching buck converter for converting the direct current (DC) voltage from the external power source to a regulated voltage suitable for charging the battery. Synchronous switching buck converters include switching transistors that modulate an output voltage coupled to one or more storage elements, such as an inductor and a capacitor, to source current at a sufficient level to efficiently charge the battery.

Forced continuous conduction mode (CCM) operation of the converter is often desired because of its frequency response and design simplicity. However, current may flow in the reverse (negative) direction, from output to input, due to body diode leakage in the high-side switching transistor. This reverse conduction is undesirable, because it may cause uncontrolled voltage or current run-away at the converter input.

To prevent this reverse conduction, some conventional voltage converters include a blocking transistor connected in series between the external power source input and switching transistors in the buck converter. Generally, this blocking transistor is conventionally controlled to conduct in the forward direction but block current in the reverse direction. Some conventional circuits have an n-channel field effect transistor (NFET) as the blocking transistor because of the higher inherent carrier mobility, and thus reduced on-resistance, of NFETs as compared with a similarly sized p-channel field effect transistors (PFETs). To reduce the forward voltage drop of a blocking NFET, some conventional implementations include a charge pump circuit to drive the gate of the blocking NFET to a "pseudo-rail" voltage above the input supply voltage. However, charge pump circuits capable of attaining the high voltages in example systems have multiple high voltage isolation tanks to avoid device breakdown and latchup conditions. Accordingly, these conventional charge pump circuits consume significant and costly chip area.

A bootstrap capacitor is useful to quickly turn on a battery NFET coupled between the battery and a system power node, when supplementing system power from the battery. The quick turn on is provided to avoid crashing the system power node, while obtaining the reduced RDSON and thus small forward voltage drop of the NFET.

Some conventional voltage converters, such as implemented in portable and mobile electronic devices (e.g., smartphones, tablets and the like), support the ability to deliver power from the device battery to an external peripheral device, such as may be plugged into the device at a USB port. This operating mode is called an "on-the-go" (OTG) mode. To deliver power in this OTG mode, the voltage converter can operate as a synchronous switching boost, or step-up, converter to provide power to the external device at a voltage higher than the battery voltage. However, if a short circuit exists at the external port as the OTG power delivery commences, the in-rush current drawn by the high-side switching transistor can crash the system power supply voltage. Accordingly, if a short circuit is detected at the power output (e.g., at the USB port), then the OTG power delivery can be quickly disabled in that event.

Some conventional voltage converters, such as the bq2419x family of system power path management devices available from Texas Instruments Incorporated, detect output short circuit conditions through control of the blocking transistor of the voltage converter during initial stages of the boost converter operation. More specifically, in a "hiccup" operating mode, the blocking transistor is briefly turned on for a short "blanking" period. If a high current through the switching transistors persists after this blanking period, then the blocking transistor is turned off to reduce the output current and thus limit the maximum load on the boost converter during startup. But this "hiccup" mode can itself induce large in-rush current that threatens system operation. Further, only certain types of loads can be powered up in such hiccup mode operation.

SUMMARY

In a voltage converter, a blocking transistor has a conduction path between a power terminal and a converter terminal. A body diode of the blocking transistor: conducts current from the power terminal to the converter terminal; and blocks current from the converter terminal to the power terminal. A first switching transistor has a conduction path between the converter terminal and a switching terminal. A second switching transistor has a conduction path between the switching terminal and a ground terminal. A first gate driver has an output coupled to a control terminal of the first switching transistor. A second gate driver has an output coupled to a control terminal of the second switching transistor. A driver circuit has an output coupled to a control terminal of the blocking transistor. A bootstrap terminal of the driver circuit is coupled to a bias input of the first gate driver.

DETAILED DESCRIPTION

Figure 1:
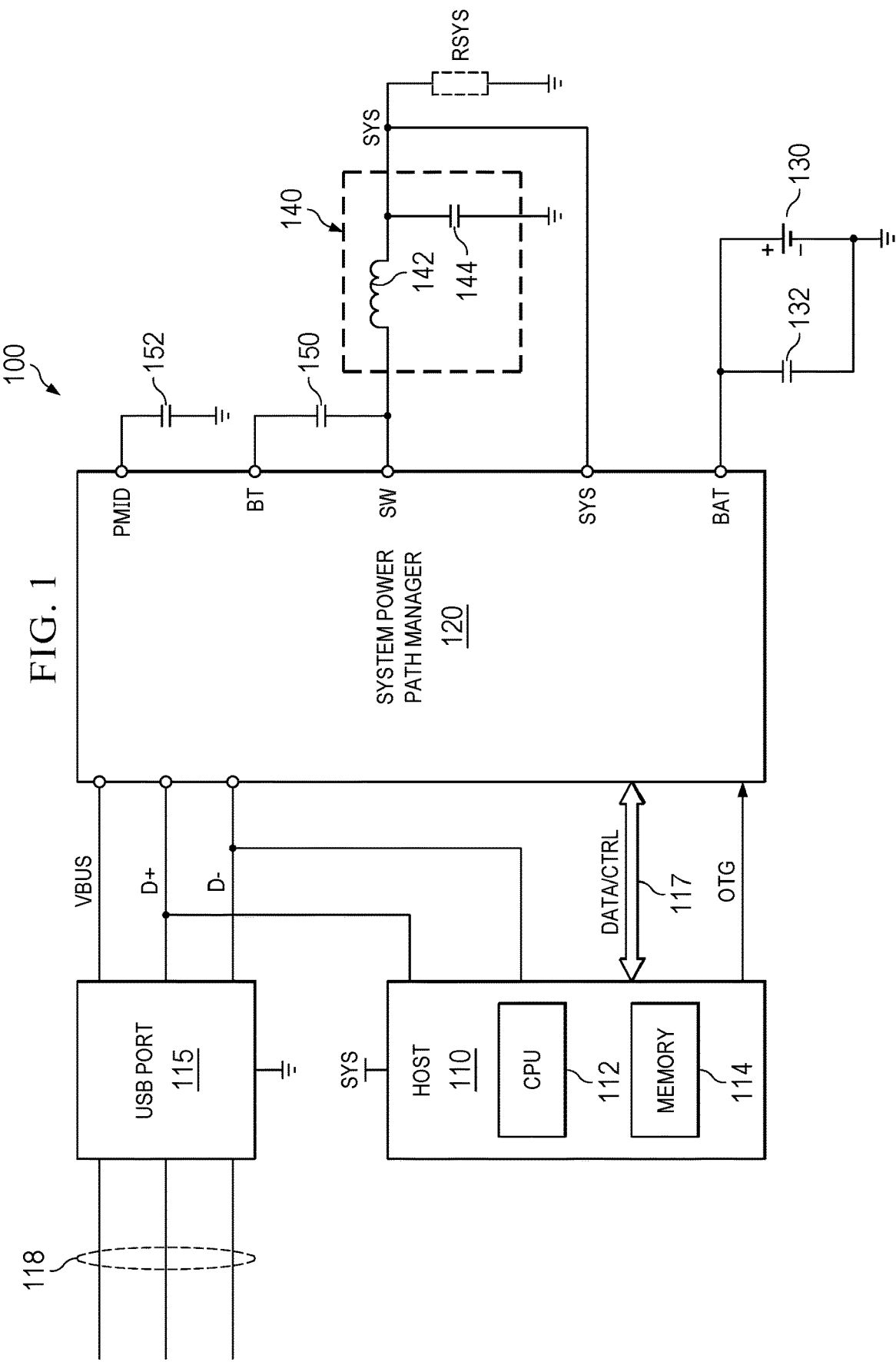
FIG. 1 is an electrical diagram, in block form, of an electronic system in which described examples may be implemented.

The same reference numbers or other reference designators are used in the drawings to illustrate the same or similar (in function and/or structure) features.

One or more embodiments are described herein in the context of a voltage converter in a battery-charging subsystem of a mobile electronic device. However, aspects of these embodiments are applicable to other applications involving DC-DC voltage converters.

FIG. 1 illustrates an example of the architecture of an electronic system into which examples may be implemented. Computing system 100 in this example is a battery-powered mobile or portable device, such as a smartphone, tablet, notebook or laptop computing device, or the like. Accordingly, system 100 includes host computer 110, which in this example includes a central processing unit (CPU) 112 such as a microprocessor, microcomputer, or other processing circuitry, and memory 114 configured to store program instructions executable by CPU 112 and data for processing or as processed by CPU 112. Host computer 110 may also include other functions suitable for the desired application of system 100, including input/output functions, data communications functions such as wireless transceivers and other network adapters, and the like. Host computer 110 may be implemented as one or more integrated circuits, such as mounted to one or more circuit boards along with the appropriate discrete components, conductors, connectors, and the like.

System 100 in this example includes system power path manager 120, which in this example is configured and operable to manage and control power in system 100, including the management and control of the charging of system battery 130, and the management and regulation of electrical power provided to host computer 110 and other functions in system 100. Battery 130 is coupled to system power path manager 120 at battery node BAT. Battery 130 may be a lithium-ion or other rechargeable battery, and is provided as a power source to host 110 and the other functions of system 100 while system 100 is not plugged into line power. As described below, while system 100 is running on battery power, system power path manager 120 couples battery node BAT to system power node SYS, from which host computer 110 and other functions in system 100 are powered.

System 100 also includes Universal Serial Bus (USB) port 115, through which it can couple to an external USB bus 118 for communication of data with an external peripheral device and, in this example, through which system 100 can couple to an external battery charger or adapter to receive power. Accordingly, system power path manager 120 has a power node VBUS coupled to the power line of a conventional four-wire USB bus arrangement at USB port 115. System power path manager 120 and host 110 may also be coupled to USB data lines D+, D– at USB port 115. Alternatively, power node VBUS may be a conductor separate from a USB bus, such as may be coupled to an external port of system 100 to receive power from a non-USB power adapter and, in some implementations as described below, may provide power to an external device via that port. System power path manager 120 is also coupled to host 110 through data/control bus 117, such as to receive control signals from host 110 and to provide status information back to host 110.

As described in further detail below, system power path manager 120 includes switching voltage converter circuitry for charging battery 130 from external power received at power node VBUS. In some implementations, as described in further detail below, system power path manager 120 may also be configured and operable to provide power from battery 130 to an external peripheral device via USB port 115 in an "On-The-Go" (OTG) operating mode. In those implementations, an additional control line OTG from host 110 to system power path manager 120 may be provided to communicate a control signal indicating to system power path manager 120 that this OTG operating mode is to be enabled. Alternatively, host 110 may enable the OTG operating mode by communicating a command or control signal to system power path manager 120 over data/control bus 117, which eliminates the need for a separate control line OTG.

In this example, passive network 140 is coupled to a switching node SW and system power node SYS of system power path manager 120. Passive network 140 includes at least one storage element for storing energy from phase to phase in the voltage converter operation. In this example, passive network 140 includes, as its storage elements, a series inductor 142 coupled between switching node SW and system power node SYS, and a capacitor 144 coupled between node SYS and system ground. The load presented by host 110 and other functions within system 100 is represented in shadow in FIG. 1 by load RSYS coupled at node SYS. Decoupling capacitor 132 is coupled in parallel with battery 130 between battery node BAT and system ground. As described above, system power path manager 120 includes circuitry that couples power supply node SYS to battery 130 via battery node BAT for system 100 from battery 130, and also for the charging of battery 130 from power node VBUS.

Bootstrap capacitor 150 is coupled between switching node SW and a bootstrap node BT of system power path manager 120 in the example of FIG. 1. As described in further detail below in connection with examples, bootstrap capacitor 150 establishes a boosted gate voltage applied to certain transistors in system power path manager 120. Capacitor 152 in system 100 is coupled between a node PMID of system power path manager 120, from which external audio may be powered in some examples, and system ground.

Figure 2:
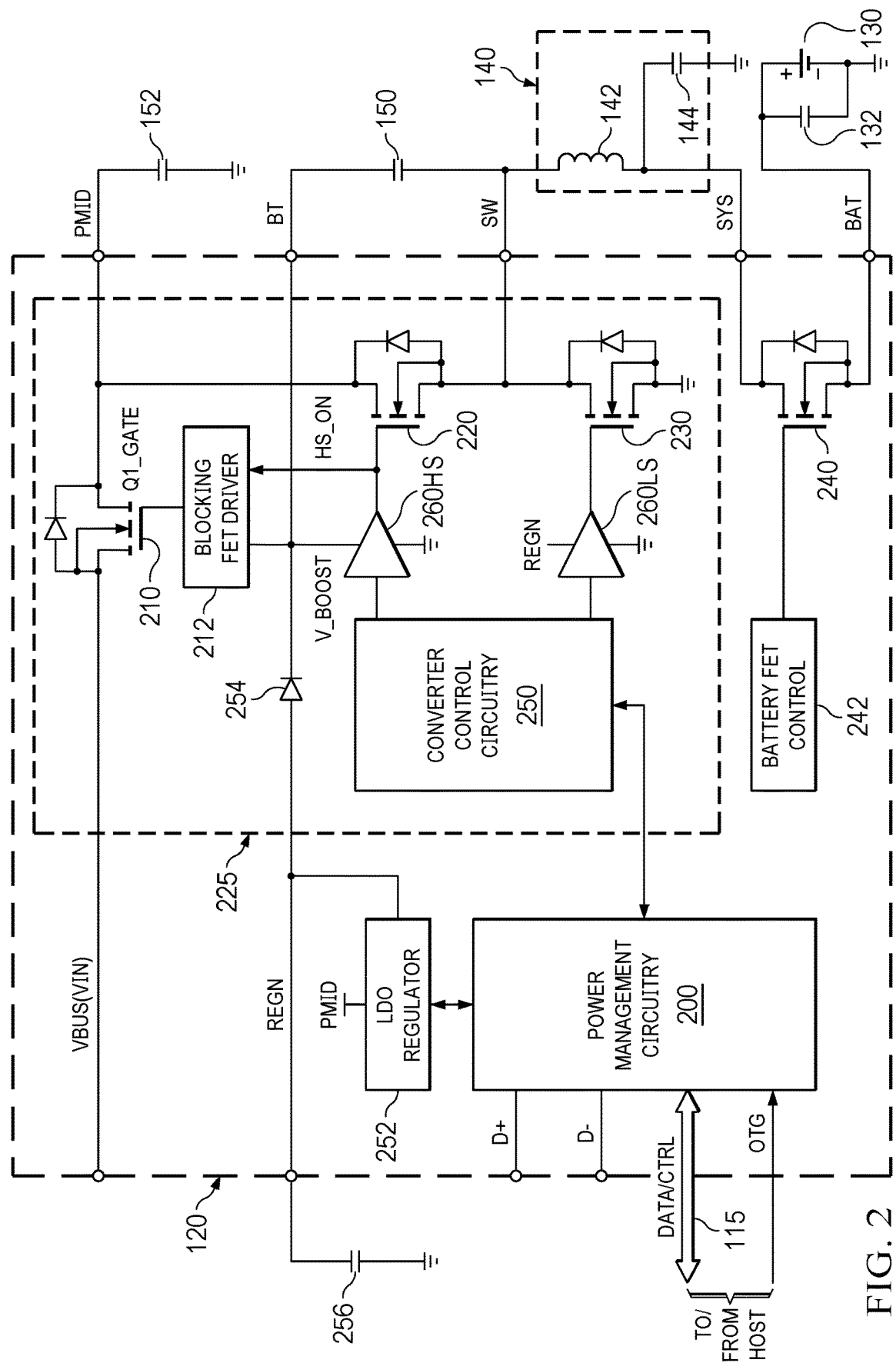
FIG. 2 is an electrical diagram, in block form, of a system power path manager according to one or more examples.

FIG. 2 illustrates the construction of system power path manager 120 according to examples. System power path manager 120 may be implemented as one or more integrated circuits. FIG. 2 shows one such implementation, in which system power path manager 120 is implemented as a single integrated circuit, in which case the various nodes (e.g., nodes VBUS, PMID, BT, SW, SYS, BAT, etc.) may correspond to physical terminals (e.g., pins or pads) of that integrated circuit. In that case, passive network 140, bootstrap capacitor 150, and the various decoupling capacitors 132, 152 may be implemented as external components to the integrated circuit of system power path manager 120. Alternatively, some or all of those external passive components may be integrated into the integrated circuit of system power path manager 120. Further in the alternative, system power path manager 120 may be implemented as multiple integrated circuits and associated components.

In this example, system power path manager 120 includes switching DC-DC voltage converter circuitry 225, which performs the charging of battery 130 and the powering of system 100 from input voltage VIN at power node VBUS. In this example, voltage converter circuitry 225 in system power path manager 120 operates as a "buck" type voltage converter in combination with network 140 to produce the desired power supply voltage at node SYS. In some implementations, voltage converter circuitry 225 operates in an OTG mode to power an external peripheral coupled at USB port 115 from battery 130. System power path manager 120 also includes power management circuitry 200 coupled to host computer 110 via data/control bus 117, and coupled to USB data lines D+, D−. Power management circuitry 200 includes logic and other circuitry configured and operable to control the overall operation of system power path manager 120, including voltage converter circuitry 225, responsive to control signals from host computer 110 or via USB data lines D+, D−. For example, power management circuitry 200 may also include current and voltage reference circuitry for generating various reference levels applied throughout system power path manger 120, USB and I2C adapters and interfaces, sequential or combinatorial logic for sensing the status of battery 130 and controlling the charging operation applied by voltage converter circuitry 225 accordingly, and the like. For example, power management circuitry 200 may include sequential or combinatorial logic for controlling the operating mode in which voltage converter circuitry 225 operates, such as responsive to a signal on control line OTG from host 110. Examples of these operating modes include a normal, non-OTG, operating mode in which voltage converter circuitry 225 operates as a buck converter to power system 100 or charge battery 130, and an OTG operating mode in which voltage converter circuitry 225 operates as a boost converter to power an external USB peripheral from battery 130 in OTG mode.

Voltage converter circuitry 225 includes various transistors in the system power path managed by system power path manager 120, which extends from power node VBUS to battery node BAT. In this power path, blocking transistor 210 is an NFET, and its source and body node are coupled to power node VBUS, and its drain is coupled to converter node PMID. This coupling of the body node of blocking transistor 210, as an NFET, orients its body diode with its cathode at node PMID and its anode at power node VBUS. In this orientation, blocking transistor 210 (which may also be referred to as a "blocking FET") operates to block reverse current flow in the event that the voltage at converter node PMID rises higher than the input voltage VIN at power node VBUS. The gate of blocking transistor 210, is coupled to an output of blocking FET driver circuit 212 to receive gate voltage Q1_GATE, as described in further detail below.

The switching portion of voltage converter circuitry 225 includes switching transistors 220 and 230 arranged as a half-bridge in this example, with transistor 220 as the high-side switching transistor and transistor 230 as the low-side switching transistor. Each of switching transistors 220 and 230 is an enhancement mode NFET in this example. Accordingly, switching transistor 220 has its drain coupled to converter node PMID and the drain of blocking transistor 210, its source coupled to switching node SW, and its control terminal (e.g., gate) driven from gate driver 260HS. Switching transistor 230, also an NFET in this example, has its drain coupled to the source of switching transistor 220 at switching node SW, its source coupled to system ground, and its control terminal (e.g., gate) driven from gate driver 260 LS. As shown in FIG. 2, switching node SW at the source of high-side switching transistor 220 and the drain of low-side switching transistor 230 is coupled to inductor 142 of passive network 140, from which a voltage is produced at system power voltage node SYS.

Converter control circuitry 250 has outputs coupled to corresponding inputs of gate drivers 260HS, 260LS. For example, converter control circuitry 250 may include sequential or combinatorial logic, pulse-width modulation circuitry, and the like, configured and operable to control switching transistors 220 and 230 as appropriate for the operating mode indicated by power management circuitry 200. In this example, converter control circuitry 250 applies signals to cause gate drivers 260HS, 260LS to for apply gate voltages to switching transistors 220, 230, respectively, at the appropriate frequency and phase to perform the voltage conversion. Gate driver 260HS has a bias node coupled to bootstrap node BT in this example.

System power voltage node SYS, from which host computer 110 and other functions of system 100 are powered, can be coupled to battery 130 through battery transistor 240. In this example, battery transistor 240 is an enhancement mode NFET, with its drain coupled to system power voltage node SYS, and its source coupled to the anode of battery 130 and capacitor 132 via battery node BAT. The control terminal (e.g., gate) of battery transistors 240 (which may also be referred as a "battery FET") is controlled by battery FET control circuit 242. Responsive to a control signal, such as from power management circuitry 200, battery FET control circuit 242 operates to turn on battery transistor 240 so that current from battery node BAT is coupled to system power voltage node SYS via its conduction path (e.g., source/drain path), such as to power system 100 in the absence of external power from power node VBUS, or to charge battery 130 from external power from power node VBUS. Commonly assigned U.S. Pat. No. 11,088,559, issued Aug. 10, 2021, entitled "Current Protection for Battery Charger," and incorporated herein by this reference, describes one example of battery FET control circuit 242 that is configured and operates to regulate current provided to and from an external battery. Other implementations of battery FET control circuit 242 may alternatively be used to control battery transistor 240, and thus control the charging of battery 130 and the providing of power from battery 130 to system power voltage node SYS.

In the example of FIG. 2, system power path manager 120 includes low drop-out (LDO) voltage regulator 252 configured and operable to produce a regulated voltage at its output (reference voltage node REGN), such as from the voltage at converter node PMID. The output of LDO regulator 252 at reference voltage node REGN is coupled to an anode of diode 254, the cathode of which is coupled to bootstrap node BT at which bootstrap capacitor 150 is coupled. In this example, a bias node of low-side gate driver 260LS is coupled to reference voltage node REGN, and is thus biased from the regulated voltage output by LDO regulator 252. Capacitor 256, such as external to system power path manager 120, is coupled between reference voltage node REGN and system ground.

In this example of system 100, such as in battery-powered mobile devices and systems, an input voltage VIN received at power node VBUS (e.g., ranging from 3.9V to 18V) is higher than the power supply voltage (e.g., ranging from 1.8V to 4.8V) required by host computer 110 and other integrated circuits in system 100, and higher than that supplied by a fully-charged battery 130. Accordingly, voltage converter circuitry 225 is operated as a buck voltage converter while an external input voltage VIN is applied at power node VBUS. With the higher external input voltage VIN applied at power node VBUS, blocking transistor 210 will appear as a forward-biased diode due to the orientation of its body diode with its anode at power node VBUS and its cathode at converter node PMID. To charge battery 130 from input voltage VIN, battery FET control circuitry 242 will turn on battery transistor 240, subject to current limits and other control functions.

In this buck voltage converter configuration, converter control circuitry 250 controls gate drivers 260HS and 260LS to turn switching transistors 220 and 230 on and off in non-overlapping high-side and low-side phases, at a frequency and duty cycle controlled in a regulated manner by power management circuitry 200 and converter control circuitry 250. During the high-side phase, converter control circuitry 250 causes high-side gate driver 260HS to apply a voltage to the gate of high-side switching transistor 220 sufficient to turn on switching transistor 220, and causes low-side gate driver 260LS to apply a voltage to the gate of switching transistor 230 to hold it off. In this phase, high-side switching transistor 220 drives current into inductor 142 from converter node PMID, raising the voltage at switching node SW. During the low-side phase, converter control circuitry 250 causes gate driver 260HS to turn off high-side switching transistor 220 and causes gate driver 260LS to turn on low-side switching transistor 230 so that its conduction path (e.g., source/drain path) conducts. Because the current through inductor 142 cannot instantaneously change, the voltage at switching node SW is initially pulled low (e.g., below system ground) in this low-side phase. Continued switching between the high-side and low-side phases results in a regulated voltage appearing at system power node SYS that may be used to power host computer 110 and other functions in system 100, and to charge battery 130 via battery transistor 240.

As voltage converter circuitry 225 operates in this manner, the voltage at switching node SW switches between high and low voltage levels as transistors 220 and 230 are switched. This switching at node SW develops a voltage across bootstrap capacitor 150, with a polarity of bootstrap node BT positive relative to switching node SW. This voltage at bootstrap node BT reverse biases diode 254 relative to the regulated voltage at reference voltage node REGN from LDO regulator 252, producing a boosted voltage V_BOOST above the voltage at converter node PMID and thus above the voltage at the drain of switching transistor 220. In this example, high-side gate driver 260HS is biased from bootstrap node BT and is configured to apply boosted voltage V_BOOST at bootstrap node BT to the gate of high-side switching transistor 220 during the high-side phase. Because the boosted voltage V_BOOST is above the voltage at the drain of switching transistor 220, switching transistor 220 is fully enhanced in the on-state, and thus exhibits a very small (e.g., 20 mV) forward voltage drop across its conduction path (e.g., source/drain path) so that switching node SW can be pulled very close to the voltage at converter node PMID in the high-side phase. Efficiency in the power delivery from voltage converter circuitry 225 is thus achieved.

According to this example, as described above, blocking transistor 210 is an enhancement mode NFET. Blocking transistor 210 has its source and body diode anode at power node VBUS and its drain and body diode cathode at converter node PMID, to permit forward current but block reverse current. While blocking transistor 210 may be an NFET as in this example, blocking transistor 210 may alternatively be implemented as a PFET, bipolar junction transistor, or other semiconductor device capable of providing this function. In any case, blocking transistor 210 ideally exhibits the characteristics of an "ideal" diode, with a small forward voltage drop across its conduction path (e.g., source/drain path). To this end, the implementation of blocking transistor 210 as an enhancement node NFET 210 can be preferable, because of the higher carrier mobility and thus lower on-state resistance of NFETs as compared with similarly sized PFETs. For blocking transistor 210 to approximate an ideal diode in the forward-biased state, however, it is useful for the level of gate voltage Q1_GATE applied in the on-state of blocking transistor 210 to exceed its drain voltage at converter node PMID by at least the threshold voltage of transistor 210, so that transistor 210 is fully enhanced in the on-state and exhibits a low forward voltage drop.

Figure 3:
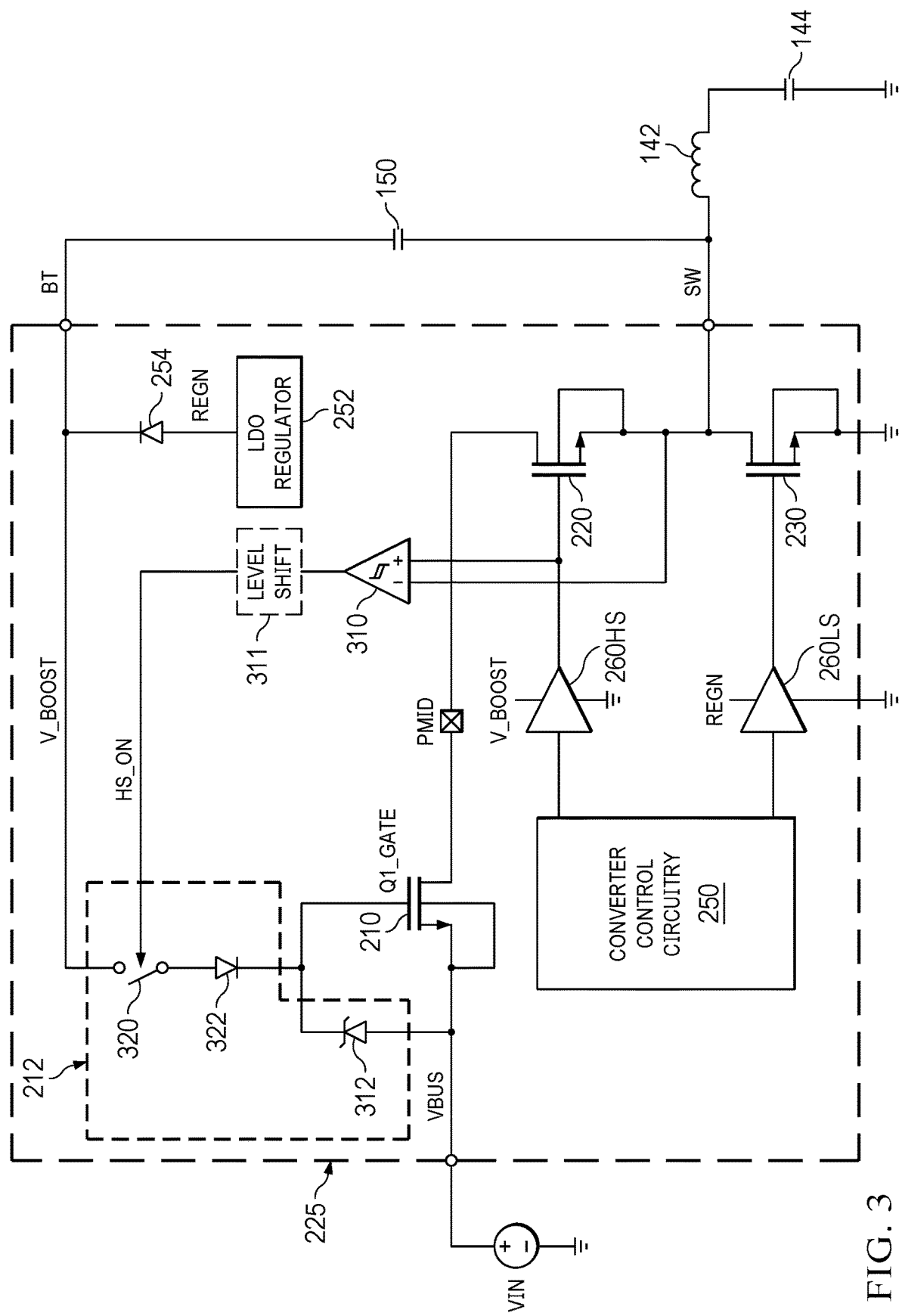
FIG. 3 is an electrical diagram, in block and schematic form, of circuitry controlling a blocking transistor in voltage converter circuitry of the system power path manager of FIG. 2, according to an example.

FIG. 3 illustrates, in further detail, portions of voltage converter circuitry 225 that pertain to blocking transistor 210 according to examples. As described above relative to FIG. 2, blocking transistor 210 has its source and body node coupled to power node VBUS to receive input voltage VIN, and its drain coupled to the drain of high-side switching transistor 220 at converter node PMID. Blocking FET driver circuit 212 has an output coupled to the gate of blocking transistor 210 at node Q1_GATE, and a bias node coupled to bootstrap node BT to receive boosted voltage V_BOOST. In this example, blocking FET driver circuit 212 also has a control input coupled to switching transistor 220 to receive a signal HS_ON indicating whether switching transistor 220 is on.

In this generalized example of FIG. 3, blocking FET driver circuit 212 can be considered to include a switch 320, a diode 322, and a Zener protection diode 312. Zener protection diode 312 has an anode coupled to the source of blocking transistor 210 and a cathode coupled to the gate of blocking transistor 210, to protect against gate-to-source overvoltage. Switch 320 is coupled between bootstrap node BT and the anode of diode 322; the cathode of diode 322 is coupled to the gate of blocking transistor 210 at node Q1_GATE. Switch 320 is controlled by signal HS_ON at the output of Schmitt trigger 310. Schmitt trigger 310 has its positive input coupled to the gate of high-side switching transistor 220 and its negative input coupled to the source of high-side switching transistor 220 (at switching node SW). Accordingly, signal HS_ON at the output of Schmitt trigger 310 has a logic high level responsive to gate driver 260HS applying a positive gate-to-source voltage to high-side switching transistor 220 to turn it on. The output of Schmitt trigger 310 is coupled to switch 320, such as by level shift circuit 311, which level-shifts signal HS_ON to the desired logic level swing (e.g., ground-referenced). In this example, switch 320 is closed by the logic high level of signal HS_ON, and when closed applies the voltage V_BOOST from bootstrap node BT to node Q1_GATE and thus to the gate of blocking transistor 210, which turns on that transistor. Conversely, responsive to high-side switching transistor 220 being turned off by gate driver 260HS, Schmitt trigger 310 drives signal HS_ON to a low logic level, responsive to which switch 320 opens.

As described above relative to FIG. 2, the switching of transistors 220, 230 by converter control circuitry 250 and gate drivers 260HS, 260LS during the buck converter operation develops a voltage across bootstrap capacitor 150. As switching node SW is pulled high by switching transistor 220 and with diode 254 reverse-biased, the voltage across bootstrap capacitor 150 boosts voltage V_BOOST at bootstrap node BT above the regulated voltage at reference voltage node REGN generated by LDO regulator 252. External capacitor 256 at reference voltage node REGN may assist the refresh of bootstrap capacitor 150. As described above, this boosted voltage V_BOOST from bootstrap capacitor 150 is applied by gate driver 260HS to the gate of switching transistor 220 to fully enhance that device.

According to these examples as shown in FIG. 3, while switching transistor 220 is turned on (signal HS_ON has a high level), the boosted voltage V_BOOST at bootstrap node BT above input voltage VIN at power node VBUS, is applied by blocking FET driver circuit 212 at node Q1_GATE. This boosted voltage V_BOOST refreshes the gate capacitance of blocking transistor 210 in the high-side phase of the buck converter cycles. Responsive to signal HS_ON at a low logic level during the low-side phases, blocking FET driver circuit 212 opens switch 320, isolating the gate of blocking transistor 210 from the top plate of bootstrap capacitor 150. After switch 320 opens, and because both of diodes 312 and 322 are reverse-biased by the boosted voltage V_BOOST at node Q1_GATE, the gate of blocking transistor 210 sees a very high discharge impedance in the low-side phase. For example, the discharge impedance at the gate of blocking transistor 210 may be sufficiently high that blocking transistor 210 remains in a fully enhanced state during the low-side buck converter phase. Responsive to gate driver 260HS turning on switching transistor 220 in the next high-side phase, the gate of blocking transistor 210 is again refreshed from boosted voltage V_BOOST to replace any dissipated gate charge.

Also, it may be desired in some applications (e.g., "true wireless" charging) to keep blocking transistor 210 off during the switching operation. Switch 320 enables blocking FET driver circuit 212 to isolate the gate of blocking transistor 210, keeping blocking transistor 210 turned off during switching in that mode of operation.

Figure 4:
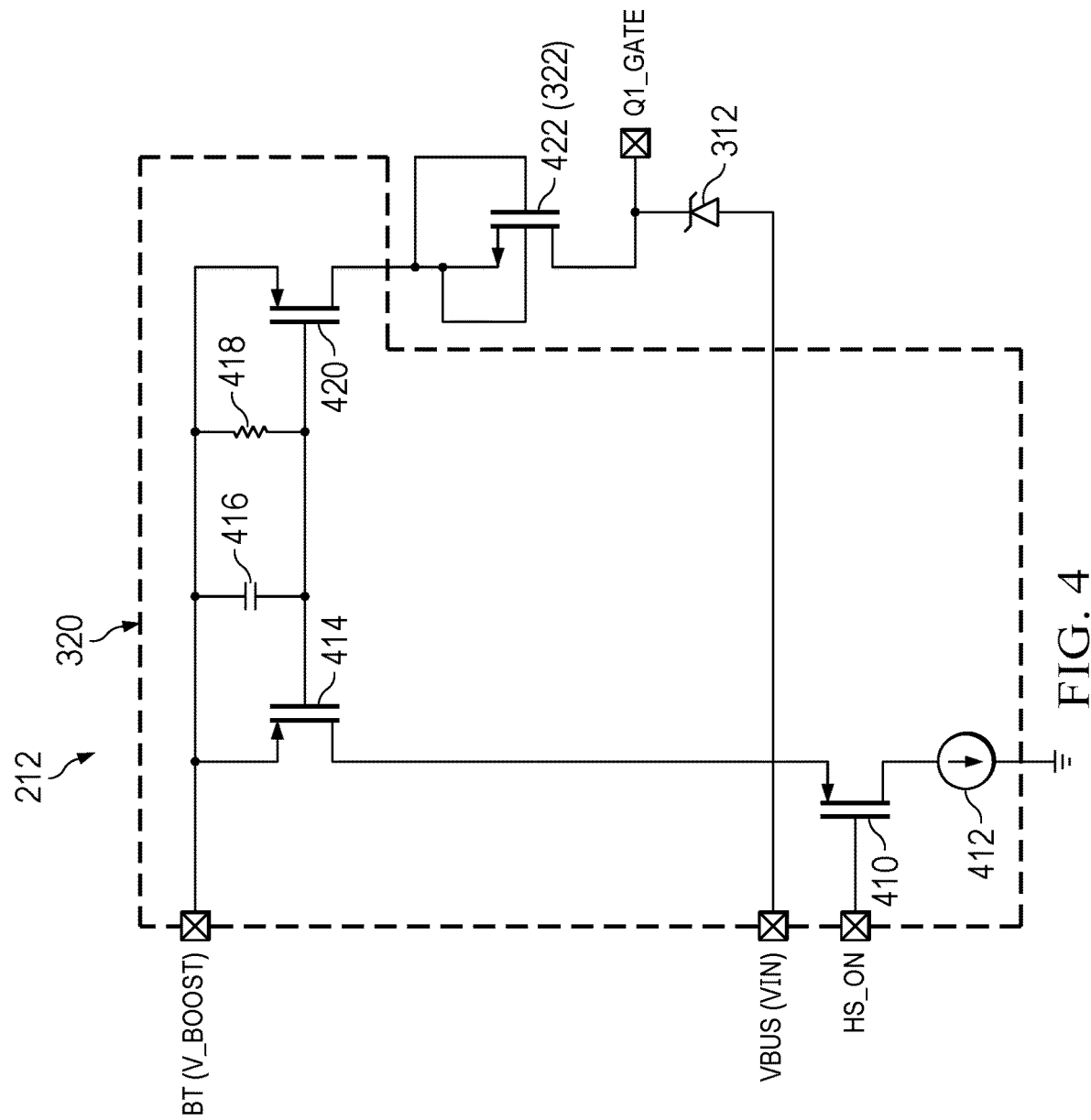
FIG. 4 is an electrical diagram, in schematic form, of a blocking transistor driver circuit according to an example implementation.

FIG. 4 illustrates in further detail the construction of blocking FET driver circuit 212 according to an example. In this example, switch 320 is implemented in a level shifter arrangement. A first leg of this level shifter includes PFET 414 with its source coupled to bootstrap node BT and its drain coupled to the drain of NFET 410. The source of NFET 410 is coupled to system ground through current source 412, which conducts a regulated current, such as may be controlled by a voltage from a reference voltage circuit (not shown) in power management circuitry 200 or elsewhere in system power path manager 120. The gate of NFET 410 is coupled to receive signal HS_ON from the output of Schmitt trigger 310 (FIG. 3). In this example, NFET 410 may be a high-voltage transistor, such as a drain-extended NMOS (DENMOS) transistor, to tolerate the high boosted voltage V_BOOST that may appear at bootstrap node BT. PFET 414 may be implemented by a smaller low voltage device, similar to logic transistors elsewhere in system 100.

The gate and drain of PFET 414 are coupled together and to the gate of PFET 420 in a second leg of blocking FET driver circuit 212. PFET 420 has its source coupled to bootstrap node BT and its drain coupled to the gate and source of NFET 422. NFET 422 has its drain (serving as the cathode of the diode) at node Q1_GATE, and its source and gate (serving as the anode of the diode) coupled to the drain of NFET 420. In this example, the body node of NFET 422 is coupled to its source, so the body diode of NFET 420 is oriented with its cathode at node Q1_GATE and its anode coupled to bootstrap node BT via transistor 420. Accordingly, NFET 422 serves the function of diode 322 in the generalized illustration of blocking FET driver circuit 212 in FIG. 3, in that it blocks conduction from node Q1_GATE to bootstrap node BT in the low-side phase of the buck converter operation. PFET 420 and NFET 422 may both be constructed as high-voltage transistors, such as drain-extended PMOS (DEPMOS) and DENMOS transistors, respectively, to tolerate the potentially high voltages at bootstrap node BT. Zener protection diode 312 has its cathode coupled to node Q1_GATE and its anode coupled to power node VBUS (at input voltage VIN). Capacitor 416 and resistor 418 are coupled between the common gates of PFETs 416, 418 and bootstrap node BT, to control the response of blocking FET driver circuit 212 as MOS transistor 410 switches on and off.

While this example is described with reference to certain transistor types (e.g., DEPMOS, DENMOS, etc.) and maximum voltage levels, alternative implementations incorporating devices of other types and voltages, as may be appropriate for different voltage ranges and available manufacturing technologies, are possible.

In operation, the logic state of signal HS_ON controls whether current is conducted through the legs of switch 320. Responsive to high-side switching transistor 220 being turned on by gate driver 260HS, Schmitt trigger 310 drives signal HS_ON to a high logic level, which turns on NFET 410 to conduct current through PFET 414 as determined by current source 412. The resulting current conducted through PFET 414 pulls its gate toward ground, which turns on PFET 420. The current conducted by transistor 420 in its on state is conducted through transistor 422 to node Q1_GATE, pulling node Q1_GATE toward the boosted voltage V_BOOST at bootstrap node BT. This boosted voltage V_BOOST is above the voltage at converter node PMID due to the bootstrapping action of bootstrap capacitor 150 as described above, so that blocking transistor 210 is fully enhanced during the high-side phase of the buck converter.

In the low-side phase, Schmitt trigger 310 drives signal HS_ON to a low logic level responsive to gate driver 260HS turning off high-side switching transistor 220. The low level of signal HS_ON turns off NFET 410, which blocks current from being conducted through PFET 414. As a result, the gates of transistors 414 and 420 are pulled to voltage V_BOOST at bootstrap node BT, turning off both. Switching transistor 230 is turned on in this low-side phase, causing the voltage at switching node SW to be pulled low by the action of inductor 142. The voltage at bootstrap node BT is pulled low as a result, which reverse-biases diode-connected transistor 422 and limits discharging of the gate of blocking transistor 210 to the top plate of bootstrap capacitor 150. Because the boosted voltage at node Q1_GATE is above input voltage VIN, Zener diode 312 is also reverse-biased. The discharge impedance from the gate of blocking transistor 210 during the low-side phase of the buck converter implemented by voltage converter circuitry 225 is thus quite high, maintaining blocking transistor 210 in an on-state and, for the most part, fully enhanced during this operation.

Figure 5:
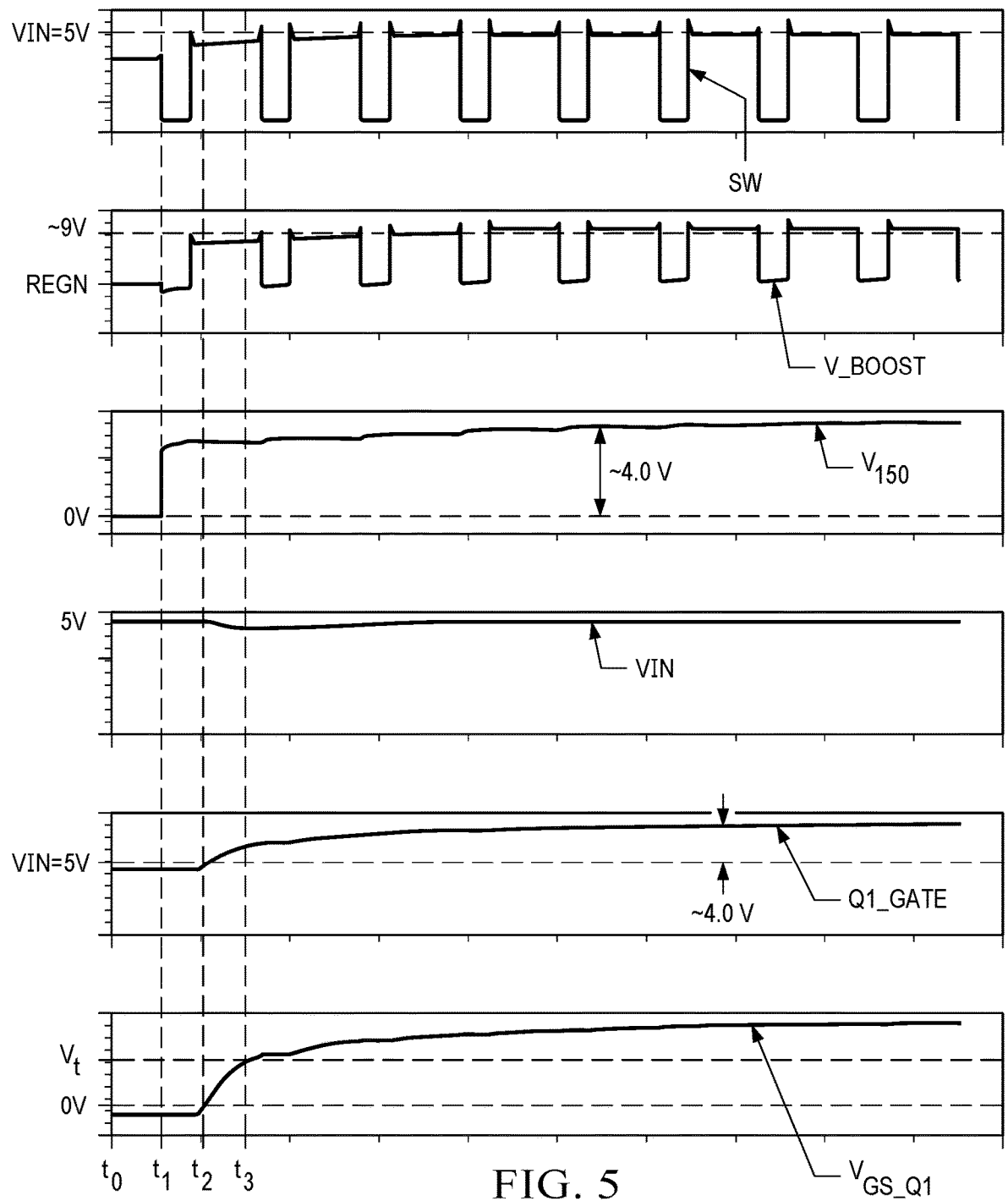
FIG. 5 is a timing diagram illustrating an example of transient response in the operation of voltage converter circuitry in the system power path manager of FIG. 2 according to an implementation.

FIG. 5 is a timing diagram illustrating the transient response at certain nodes of voltage converter circuitry 225 according to the example described above relative to FIG. 2 through FIG. 4 and based on circuit simulation. In the example of FIG. 5, input voltage VIN is about 5.0 V, and voltage converter circuitry 225 switches switching transistors 220 and 230 at a period of about 600 nsec, at a duty cycle greater than 50% (e.g., about 75%). Bootstrap capacitor 150 has a capacitance of about 47 nF in this example.

At time $t_0$ in the example of FIG. 5, voltage converter circuitry 225 has not yet begun switching. Accordingly, a voltage $V_{150}$ across bootstrap capacitor 150 has not developed (e.g., $V_{150}$=0V at time $t_0$), and as such voltage V_BOOST is about at the voltage at reference voltage node REGN from regulator circuit 252 (e.g., ~5V) at time $t_0$. Gate voltage Q1_GATE has about the level of input voltage VIN via Zener diode 312. The gate to source voltage $V_{GS\_Q1}$ is accordingly at about 0V, which is below the threshold voltage of blocking NFET 210.

Switching of voltage converter circuitry 225 begins at about time $t_1$ in the example of FIG. 5, initially with a low-side phase in which switching transistor 230 is turned on, pulling switching node SW low, followed by a high-side phase in which switching transistor 220 is turned on to pull switching node SW to a higher voltage. The non-overlapping switching of switching transistors 220, 230 continues at the switching frequency after time $t_1$. As switching node SW modulates after time $t_1$, a positive voltage $V_{150}$ develops across bootstrap capacitor 150, producing a boosted voltage V_BOOST above the voltage at reference voltage node REGN as switching node SW is pulled high during each high-side phase. Beginning at about time $t_2$, boosted voltage V_BOOST raises gate voltage Q1_GATE above the level of input voltage VIN, in turn increasing the gate-to-source voltage $V_{GS\_Q1}$ at blocking transistor 210 to a level at or above its threshold voltage V, at about time $t_3$, turning on blocking transistor 210. As voltage converter circuitry 225 continues its switching, the voltage $V_{150}$ across bootstrap capacitor 150 eventually increases to about 4.0 V in this example, so boosted voltage V_BOOST eventually reaches about 9.0 V during high-side phases of the buck converter operation, well above input voltage VIN and thus above the voltage at node PMID at the drain of blocking transistor 210. As described above, the high discharge impedance from the gate of blocking transistor 210 maintains the boosted voltage at node Q1_GATE during the low-side phase (e.g., shown at switching node SW), maintaining blocking transistor 210 on and fully enhanced during normal operation of the buck converter.

While blocking transistor 210 according to these examples remain on during the operation of voltage converter circuitry 225 as a buck converter, blocking transistor 210 is also responsive to block reverse current from node converter input PMID to power input line VBUS following the removal of an external power source. For example, during the charging of battery 130 from an external power adapter or charger, such as may be connected to system 100 via USB port 115, the user may unplug the external charging device from USB port 115, potentially exposing a conductor coupled to power input line VBUS at the port. In the event that power input line VBUS is discharged, such as by a user touching the external conductor, the voltage at power input line VBUS will fall below the voltage at node converter input PMID (e.g., from battery 130), inducing a reverse current flow toward power input line VBUS. Even with blocking FET driver 212 not energizing its gate, the body diode of blocking NFET 210 is reverse-biased in this event, blocking the reverse current from converter node PMID to power input line VBUS.

According to these examples, blocking transistor 210 is provided in system power path manager 120 to block undesired reverse current flow through its voltage converter circuitry 225, with only a small forward voltage drop during such time as external power is charging battery 130 and powering system 100. More specifically, the reduced on-state resistance provided by the implementing of blocking transistor 210 with an enhancement mode NFET is attained by efficiently bootstrapping the gate of that device to attain full enhancement during the high-side phase of the voltage conversion. Efficiency is attained by using the same bootstrap capacitor for the blocking FET gate as is used in driving the gate of the high-side switching transistor 220 in voltage converter circuitry 225. Significant savings in chip area, such as compared with charge pump circuitry, and a reduction in circuit complexity can thus be attained.

As described above, some conventional voltage converters support an OTG mode, in which power may be delivered from the system battery to an external peripheral device. For example, if system power path manager 120 of system 100 in FIG. 1 provides such an OTG mode, its voltage converter circuitry can operate in the OTG mode to deliver power from system battery 130 to an external device plugged into or connected at USB port 115. However, a short circuit at USB port 115 in this OTG can result in large in-rush current drawn by high-side switching transistor 220, which can crash the voltage at system power supply node SYS.

In an alternative example, system power path manager 120 is constructed and operates to detect and respond to a short circuit or other high load condition at the external port, such as USB port 115, at which an external device is coupled and is to be powered from battery 130 in an OTG operating mode. More particularly, in view of the following description, this alternative approach efficiently implements gate drive circuitry that controls the gate drive of blocking transistor 210 at the initiation of the OTG mode power delivery so as to permit rapid detection and response to an output short circuit condition. Further, according to this alternative approach, the gate drive of blocking transistor 210 is driven from bootstrap node BT in the OTG operating mode also, so that blocking transistor 210 is fully enhanced when fully on, reducing its source-drain voltage drop when powering an external device from power node VBUS.

Figure 6:
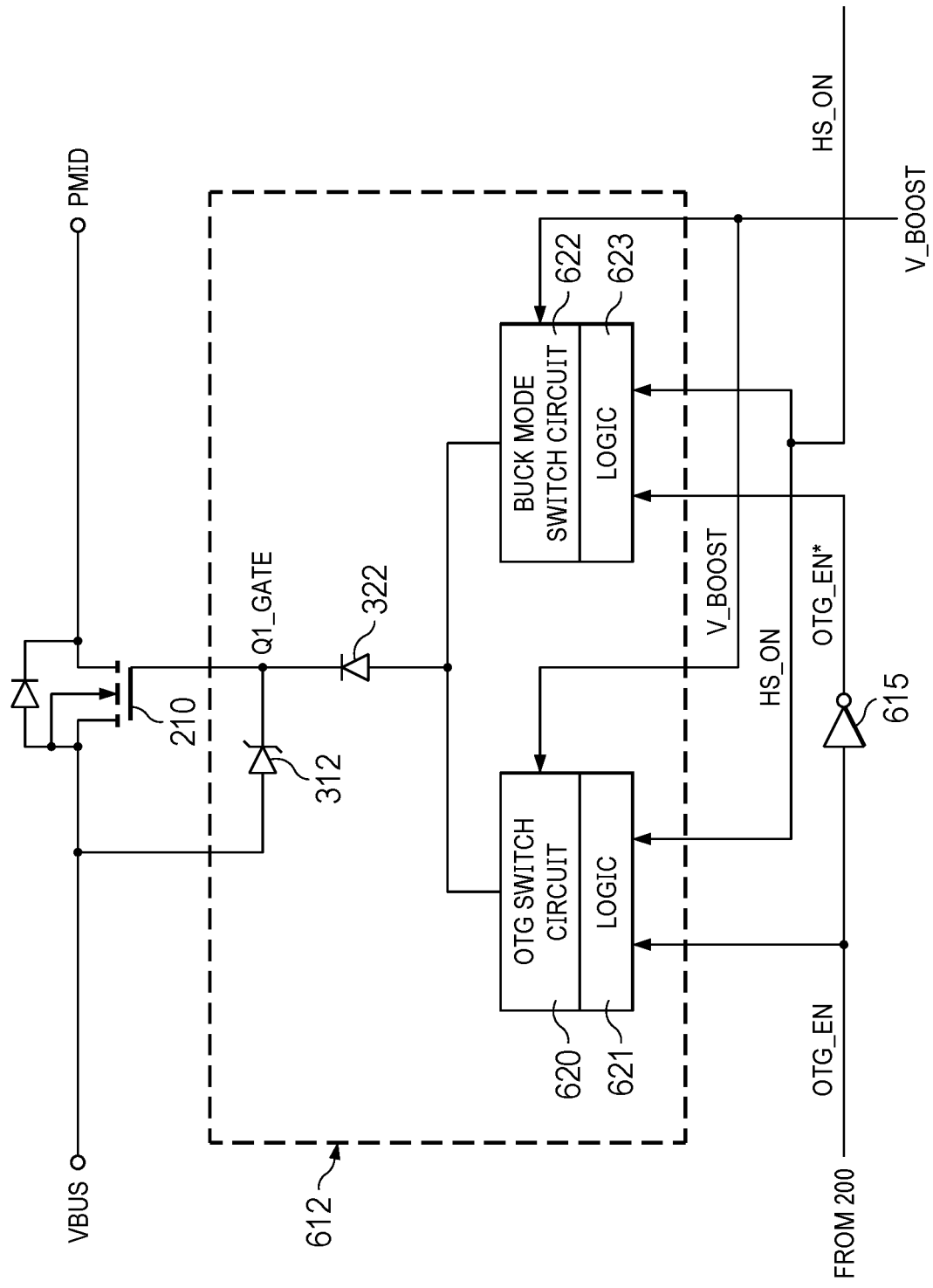
FIG. 6 is an electrical diagram, in block form, of gate drive circuitry for a blocking transistor in voltage converter circuitry of the system power path manager of FIG. 2, according to an alternative example.

FIG. 6 illustrates the implementation of blocking FET driver circuit 612 configured to drive the gate of blocking transistor 210 according to this alternative example. In this example, blocking FET driver circuit 612 includes both an OTG switch circuit 620 and a buck mode switch circuit 622, each with an output coupled to the anode of diode 322. The cathode of diode 322 is coupled to the gate of blocking transistor 210 at node Q1_GATE. Accordingly, diode 322 is shared by both of switch circuits 620 and 622; alternatively, each of the switch circuits 620 and 622 may include its own diode 322.

OTG switch circuit 620 has an input receiving boosted voltage V_BOOST from bootstrap node BT, and is also coupled to logic circuitry 621. Logic circuitry 621 has an input receiving signal HS_ON (e.g., from Schmitt trigger 310 of FIG. 3), and an input receiving control signal OTG_EN, such as from power management circuitry 200. In this example, control signal OTG_EN indicates whether system power path manager 120 is in the OTG operating mode (e.g., as requested from host 110 on control line OTG of FIG. 1). Control signal OTG_EN communicated from power management circuitry 200 may correspond to the signal communicated from host 110 on control line OTG. Alternatively, power management circuitry 200 may generate control signal OTG_EN based on a logical combination of a signal received on control line OTG with one or more status indications of the voltages at certain circuit terminals of system power path manager 120. For example, power management circuitry 200 may include logic circuitry generating control signal OTG_EN to enable the OTG operating mode based on a logical combination of a signal from host 110 on control line OTG with status indications that voltage at battery 130 is above a certain threshold voltage in combination with the voltage at power node VBUS being less than the voltage at battery 130 (plus or minus some margin). In this manner, power management circuitry 200 can ensure that relevant voltages are at levels conducive to the OTG operation before enabling that mode.

Buck mode switch circuit 622 is operable in a normal operating mode (e.g., non-OTG mode, or buck converter mode) in which system 100 is being powered from external power at USB port 115, and in which battery 130 can be charged from this external power. As in the example described above relative to FIG. 3, buck mode switch circuit 622 has an input receiving boosted voltage V_BOOST from bootstrap node BT, and is also coupled to logic circuitry 623. Logic circuitry 623 has an input coupled receiving signal HS_ON (e.g., from Schmitt trigger 310 of FIG. 3) and an input receiving control signal OTG_EN* from the output of inverter 615. The input of inverter 615 is coupled to receive control signal OTG_EN from power management circuitry 200, and as such control signal OTG_EN* is the logical complement of control signal OTG_EN. In this example, buck mode switch circuit 622 is enabled in a normal (non-OTG) operating mode, while OTG switch circuit 620 is enabled in the OTG operating mode.

Other control signals, in addition to signal HS_ON and control signal OTG_EN (and its complement), may also be applied to logic circuitry 621, 623, depending on the particular implementation. For example, system power path manager may have an operating mode in which blocking transistor 210 is to be disabled, in which case an additional enable signal may be provided by power management circuitry 200. In some implementations, blocking transistor 210 may be fabricated as multiple physical transistors in parallel, each associated with a blocking FET driver circuit 612. In such a case, logic circuitry 621, 623 for each instance (or group of instances) may receive a block enable signal from power management circuitry 200 so that one or more of the parallel instances of blocking transistor 210 may be selectively enabled while others are disabled.

Figure 7A:
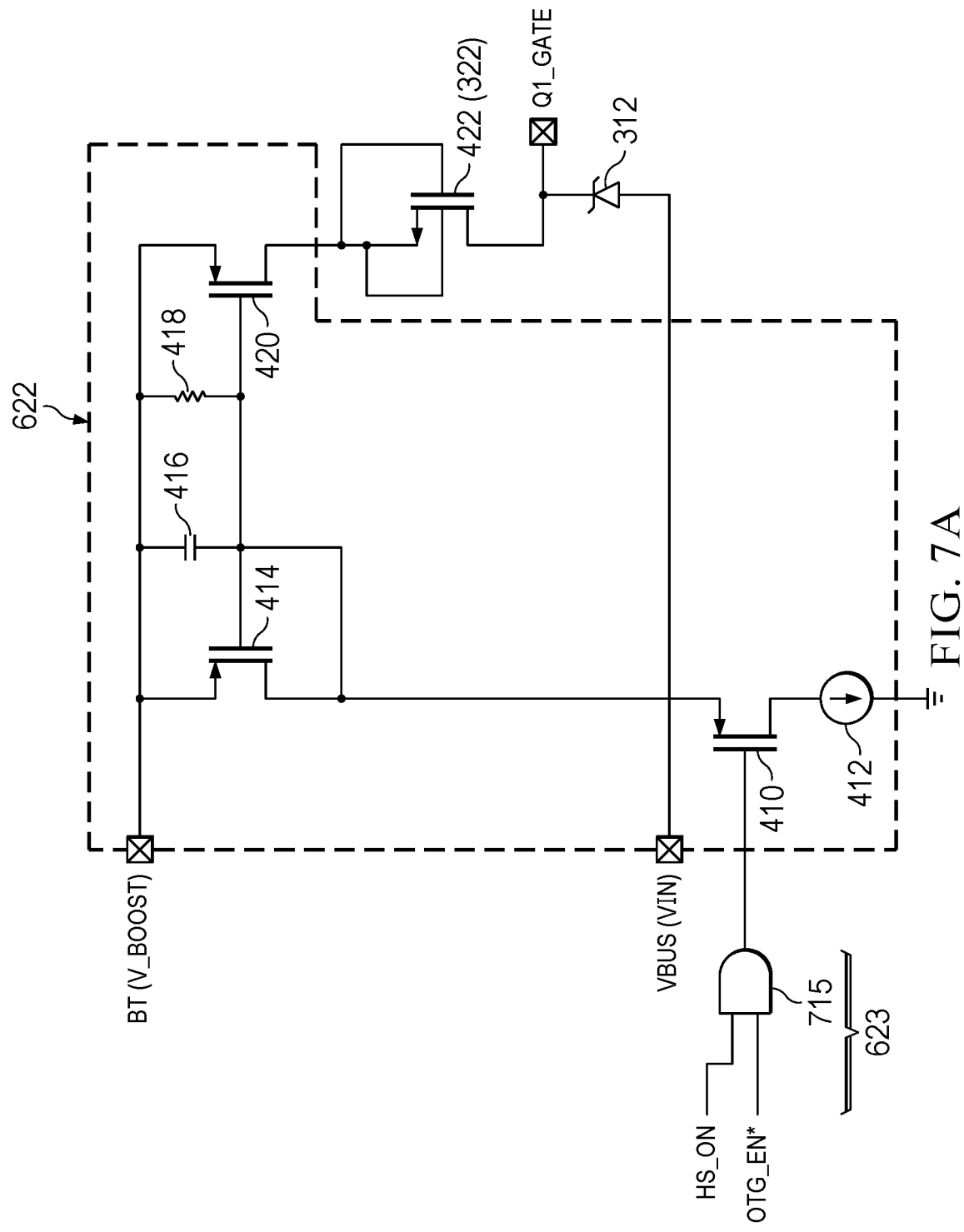
FIG. 7A is an electrical diagram, in schematic form, of an example of a non-OTG blocking transistor driver circuit in the gate drive circuitry of FIG. 6.

FIG. 7A illustrates the construction of buck mode switch circuit 622 according to this example. FIG. 7A uses the same reference numbers and other reference designators to illustrate the same or similar features as used in FIG. 4 to describe blocking FET driver circuit 212. As evident from FIG. 6B, buck mode switch circuit 622 is similarly constructed in the form of a level shifter, as described above relative to FIG. 4. In this example of FIG. 7A, AND gate 715 serves as logic circuitry 623, and has one input receiving signal HS_ON and another input receiving control signal OTG_EN*. The gate of NFET 410 in a first leg of buck mode switch circuit 622 is coupled to the output of AND gate 715.

In this example, power management circuitry 200 drives control signal OTG_EN to a high logic level to enable the OTG operating mode, and to a low logic level to disable the OTG operating mode, such as in a normal non-OTG operating mode. Because control signal OTG_EN* is the logical complement of control signal OTG_EN due to the action of inverter 615, buck mode switch circuit 622 is disabled by AND gate 715 in the OTG operating mode in which control signal OTG_EN* has a low logic level. Conversely, control signal OTG_EN* has a high logic level in a normal non-OTG operating mode. In this mode, buck mode switch circuit 622 is enabled by AND gate 715 to drive node Q_GATE responsive to signal HS_ON, such as in the manner described above relative to FIG. 4.

Figure 8:
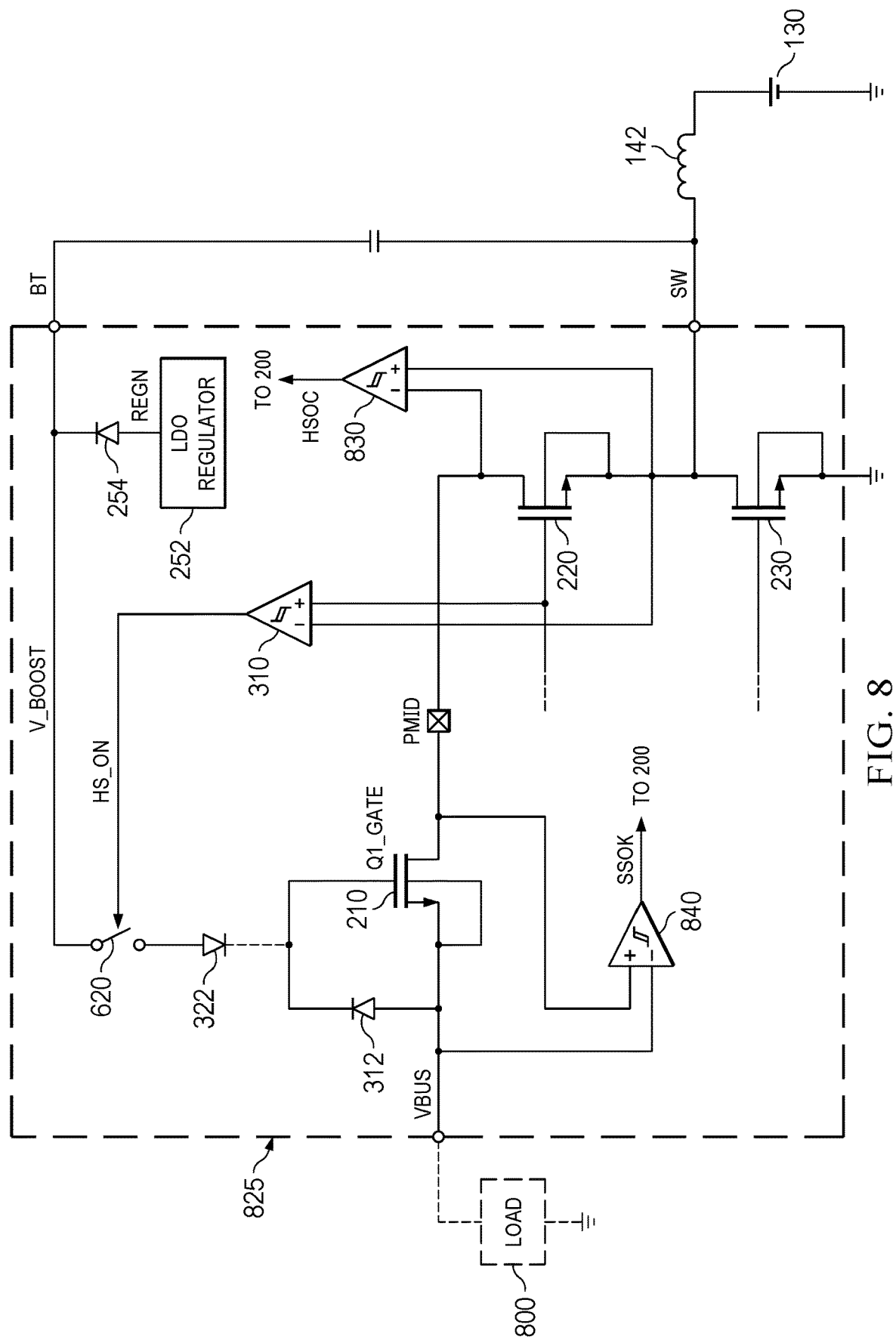
FIG. 8 is an electrical diagram, in block and schematic form, of an OTG blocking transistor driver circuit in voltage converter circuitry of the system power path manager of FIG. 2 according to this alternative example.

FIG. 8 illustrates, in further detail, portions of voltage converter circuitry 825 according to this alternative example, specifically certain portions that pertain to OTG switch circuit 620 as it drives the gate of blocking transistor 210 through diode 322 in the OTG operating mode. The same reference numbers and other reference designators are used in FIG. 8 to illustrate the same or similar features as in FIG. 3 described above. As described above relative to FIG. 2, blocking transistor 210 has its source and body node coupled to power node VBUS to receive input voltage VIN, and its drain coupled to the drain of high-side switching transistor 220 at converter node PMID. OTG blocking FET driver switch circuit 620 (represented by switch 620 in FIG. 8) has an output coupled to the gate of blocking transistor 210 at node Q1_GATE through diode 322, and a bias node coupled to bootstrap node BT to receive boosted voltage V_BOOST. In this example, OTG switch circuit 620 also has a control input coupled to switching transistor 220 to receive a signal HS_ON indicating whether switching transistor 220 is on. Zener protection diode 312 has an anode coupled to the source of blocking transistor 210 and a cathode coupled to the gate of blocking transistor 210, to protect against gate-to-source overvoltage.

In the OTG operating mode (e.g., control signal OTG_EN at a high logic level), OTG switch circuit 620 is controlled by signal HS_ON from the output of Schmitt trigger 310 which, as described above relative to FIG. 3, has a logic high level responsive to a sufficiently positive gate-to-source voltage at high-side switching transistor 220. In this example and in the OTG operating mode, OTG switch circuit 620 is closed by the logic high level of signal HS_ON to drive node Q1_GATE from boosted voltage V_BOOST at bootstrap node BT. Conversely, responsive to high-side switching transistor 220 being turned off by gate driver 260HS, Schmitt trigger 310 drives signal HS_ON to a low logic level, responsive to which OTG switch circuit 620 opens.

Voltage converter circuitry 825 according to this example includes additional control functions that play a role in the startup of the OTG operation. Schmitt trigger 830 has one input (e.g., its negative input) coupled to the drain of switching transistor 830, and another input (e.g., its positive input) coupled to the source of switching transistor 830 at switching node SW. The output of Schmitt trigger 830 drives a signal HSOC, which may be communicated to either or both of power management circuitry 200 and converter control circuitry 250. Signal HSOC indicates (e.g., with a high logic level) that the source-to-drain voltage across switching transistor 220 exceeds a threshold corresponding to an overcurrent condition, as may be caused by a short circuit at load 800 coupled to power node VBUS. In one example, either or both of power management circuitry 200 and converter control circuitry 250 is configured to respond to signal HSOC indicating an overcurrent condition by disabling the switching of switching transistors 220, 230.

Voltage converter circuitry 825 according to this example also includes Schmitt trigger 840, which has one input (e.g., its negative input) coupled to the drain of blocking transistor 210 at node PMID, and another input (e.g., its positive input) coupled to the source of blocking transistor 210 at power node VBUS. The output of Schmitt trigger 840 drives a signal SSOK, which may be communicated to which may be communicated to either or both of power management circuitry 200 and converter control circuitry 250. Signal SSOK indicates (e.g., with a high logic level) that the voltage at power node VBUS has approached the voltage at node PMID within a threshold voltage selected to indicate a successful startup of voltage converter circuitry 825 in its OTG "boost" mode.

As described above, OTG switch circuit 620 drives node Q1_GATE from the boosted voltage V_BOOST at bootstrap node BT, similarly as buck mode switch circuit 622 described above. In contrast, however, OTG switch circuit 620 in this example of FIG. 8 is constructed to initially drive node Q1_GATE with a relatively small and controlled current, turning on blocking transistor 210 relatively slowly from the beginning of the OTG operation, gradually reaching full turn-on. Because OTG switch circuit 620 drives node Q1_GATE from bootstrap node BT also in this OTG operating mode, blocking transistor 210 is fully enhanced when fully turned on, reducing the source-drain voltage drop across blocking transistor 210 when an external device at power node VBUS is powered from battery 130.

Figure 9:
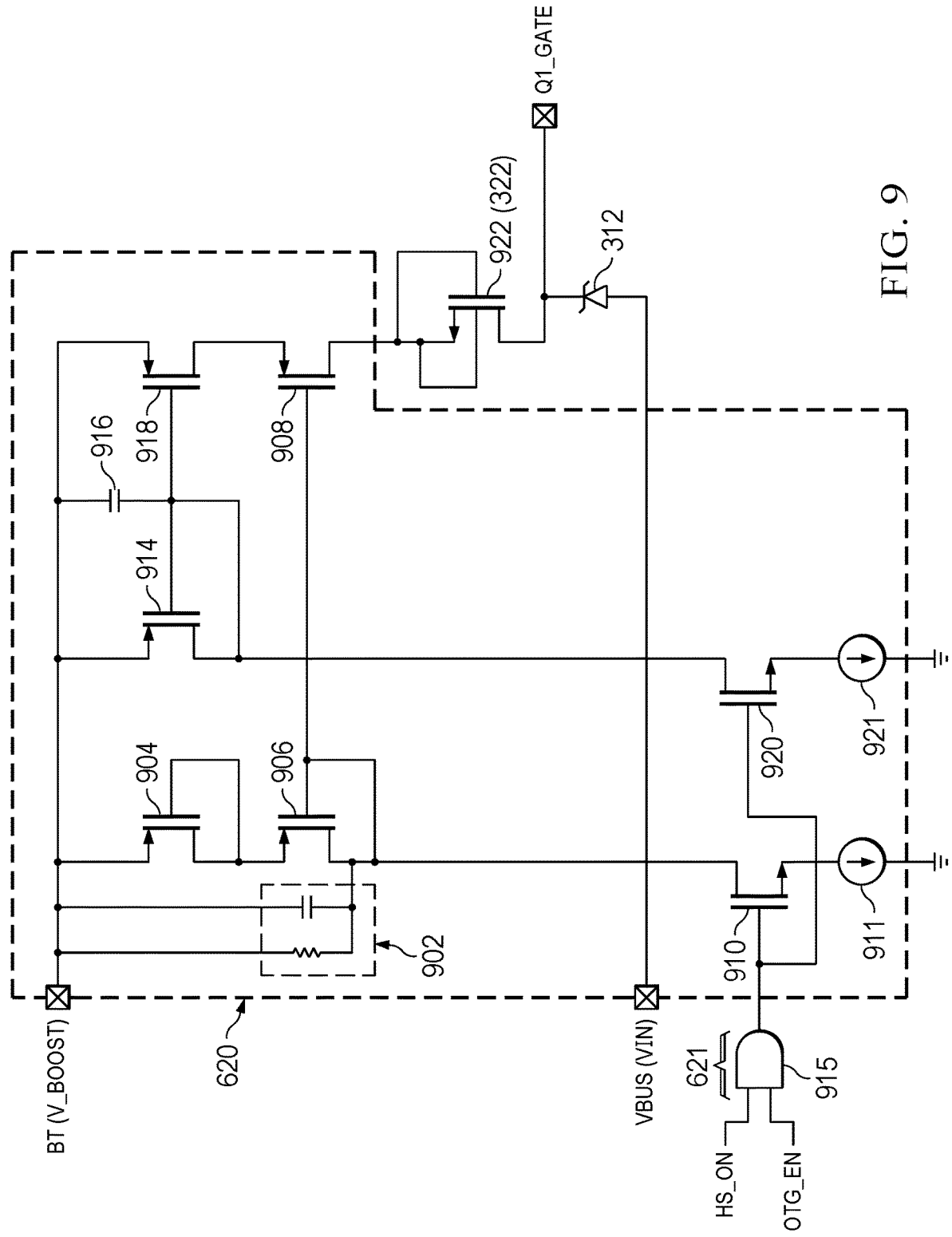
FIG. 9 is an electrical diagram, in schematic form, of an example of the OTG blocking transistor driver circuit of FIG. 8.

FIG. 9 illustrates in further detail the construction of OTG switch circuit 620 according to an example implementation. OTG switch circuit 620 is implemented in a level shifter arrangement with three legs. A first leg includes diode-connected PFET 904 with its source coupled to bootstrap node BT, and its gate and drain coupled to the source of PFET 906. PFET 904 may be constructed as a relatively low voltage (e.g., 1.8V) device. PFET 906 in this example may be constructed to have a relatively long channel length, as compared with transistor 904, and to tolerate higher voltages (e.g., 5V). Parallel resistor-capacitor (RC) network 902 is coupled between bootstrap node BT and the gate and drain of PFET 906. PFET 906 has its gate and drain coupled to the drain of NFET 910, and NFET 910 has its source coupled to system ground through current source 911. Current source 911 conducts a regulated current, such as may be controlled by a voltage from a reference voltage circuit (not shown) in power management circuitry 200 or elsewhere in system power path manager 120. In this example, NFET 910 may be implemented as a high-voltage transistor, such as a drain-extended NMOS (DENMOS) transistor, to tolerate the high boosted voltage V_BOOST that may appear at bootstrap node BT. In this example of FIG. 9, AND gate 915 serves as logic circuitry 621, and has one input receiving signal HS_ON and another input receiving control signal OTG_EN. The gate of NFET 910 is coupled to the output of AND gate 915.

A second leg of OTG switch circuit 620 in this example includes PFET 914, which has its source coupled to bootstrap node BT and its drain coupled to the drain of NFET 920. PFET 914 may be constructed as a low voltage transistor, similarly as PFET 904. The source of NFET 920 is coupled to system ground through current source 921, which conducts a regulated current, such as may be controlled by a voltage from a reference voltage circuit (not shown) in power management circuitry 200 or elsewhere in system power path manager 120. In this example, the regulated current conducted by current source 921 may be a relatively small current, such as smaller than the current conducted by current source 911, and will establish the level of current applied to the gate of blocking transistor 210 during startup, as described below. NFET 920 may be implemented as a high-voltage transistor, such as a drain-extended NMOS (DENMOS) transistor, to tolerate the high boosted voltage V_BOOST that may appear at bootstrap node BT. PFET 914 may be implemented by a smaller low voltage device, similar to logic transistors elsewhere in system 100.

The gate of NFET 920 is also coupled to the output of AND gate 915, so as to be similarly gated as transistor 910 responsive to signal HS_ON in the OTG operating mode. Conversely, in a normal, non-OTG, operating mode, control signal OTG_EN will have a low logic level, holding the output of AND gate 915 at a low logic level and disabling OTG switch circuit 620 by preventing AND gate 915 from responding to signal HS_ON.

In a third, output, leg of OTG blocking FET driver circuit 620, PFET 918 has its source coupled to bootstrap node BT. The gate of PFET 918 is coupled to the gate and drain of transistor 914, and the drain of PFET 918 is coupled to the source of PFET 908. PFET 918 may be constructed as a low voltage transistor, similarly as PFETs 904 and 914 in the first and second legs. The gate and drain of long channel PFET 906 are coupled to the gate of PFET 908. The drain of PFET 908 is coupled to the gate and source of NFET 922, which has its drain coupled to node Q1_GATE. In this example, the body node of NFET 922 is coupled to its source, so the body diode of NFET 922 is oriented with its cathode at node Q1_GATE and its anode coupled to bootstrap node BT through transistors 908 and 918. Accordingly, NFET 922 serves the function of diode 322 in the generalized illustration of OTG switch circuit 620 in FIG. 8, in that it blocks conduction from node Q1_GATE to bootstrap node BT. PFET 908 and NFET 922 may both be constructed as high-voltage transistors, such as drain-extended PMOS (DEPMOS) and DENMOS transistors, respectively, to tolerate the potential high voltages at bootstrap node BT, and thus protect small, low voltage, PFET 918 from those voltages. Zener protection diode 312 has its cathode coupled to node Q1_GATE and its anode coupled to power node VBUS. Capacitor 916 is coupled between the common gates of PFETs 914, 918 and bootstrap node BT.

In operation in a normal, non-OTG, operating mode, control signal OTG_EN will have a low logic level, forcing AND gate 915 to drive a low logic level at its output regardless of signal HS_ON, disabling OTG switch circuit 620 by holding transistors 910, 920 in an off state.

Conversely, in the OTG operating mode (control signal OTG_EN at a high logic level) in which the voltages at power node VBUS and battery 130 are at suitable levels (with no overcurrent condition at switching transistor 220), AND gate 915 is enabled to respond to the level of signal HS_ON from Schmitt trigger 310. In this mode, signal HS_ON is asserted by Schmitt trigger 310 responsive to switching transistor 220 turned on in the OTG boost operation, causing AND gate 915 to turn on NFET 910 and 920. With transistor 920 on, the reference current conducted by current source 921 is conducted by NFET 920 and PFET 914, which in turn turns on PFET 918 in the third leg of OTG blocking FET driver circuit 620. According to this example, however, the drive applied to node Q1_GATE via PFET 918 is controlled by PFET 908, which in turn is controlled by the current conducted by transistor 906 in the first leg.

As described above in connection with these examples, OTG switch circuit 620 is arranged to provide a "soft-start" to the operation of voltage converter circuitry 825 as a boost converter in the OTG mode. This soft-start is provided by the relatively small and accurately regulated current conducted by current source 921 responsive to signal HS_ON, and the current mirror established by small, low voltage, transistors 914 and 918. This small regulated current of current source 921 controls the mirrored current through PFET 918 in the output leg of OTG switch circuit 620, which serves as the current applied during startup to the gate of blocking transistor 210.

According to this example, referring to FIG. 8, Schmitt trigger 830 monitors the source-to-drain voltage across switching transistor 220 during this slow turn-on of blocking transistor 210 by OTG switch circuit 620. In the event that switching transistor 220 conducts excessive current (e.g., if load 800 at power node VBUS is a short circuit), the resistive voltage drop across the source and drain of switching transistor 220 can exceed the threshold of Schmitt trigger 830, causing it to issue a high logic level at overcurrent signal HSOC to power management circuitry 200. As described above, this overcurrent signal HSOC may be used by power management circuit 200, such as to cause converter control circuitry 250 to disable the switching of switching transistors 220, 230 responsive to overcurrent signal HSOC indicating an overcurrent condition at switching transistor 220.

In contrast, so long as overcurrent at switching transistor 220 is not detected by Schmitt trigger 830 (e.g., overcurrent signal HSOC remains at a low logic level), the current conducted through the output leg of OTG switch circuit 620 will eventually drive node Q1_GATE to the voltage at bootstrap node BT. The gate capacitance of blocking transistor 210 along with the level of the regulated current of current source 921, as mirrored through low voltage PFET 918, determines the duration of this soft-start turn-on of blocking transistor 210. The use of low voltage PFETs 914 and 918 as a current mirror, assists in accurate control of this gate current, and in avoiding an overcurrent condition during soft-start. As described above, a boosted voltage V_BOOST is produced at bootstrap node BT by the bootstrapping action of bootstrap capacitor 150. After this initial soft-start interval, node Q1_GATE will substantially have the level of boosted voltage V_BOOST, fully enhancing blocking transistor 210 during the boost converter operation.

During the low-side phase of voltage converter circuitry 825 (in which signal HS_ON has a low logic level), diode 922 is reverse-biased to limit discharge of the gate of blocking transistor 210 to the top plate of bootstrap capacitor 150. Because the boosted voltage at node Q1_GATE is above input voltage VIN, Zener diode 312 is also reverse-biased. The discharge impedance from the gate of blocking transistor 210 during the low-side phase of the boost converter operation is thus quite high, maintaining blocking transistor 210 in an on-state and, for the most part, fully enhanced during this operation.

Referring again to FIG. 8, following the soft-start of blocking transistor 210 provided by OTG switch circuit 620 as described above, the voltage at power node VBUS is stepped up by voltage converter circuitry 825 continuing operation as a boost converter. Responsive to the voltage at power node VBUS approaching the voltage at node PMID within the threshold level at Schmitt trigger 840, Schmitt trigger 840 issues a high logic level at signal SSOK, indicating to power management circuitry 200 that the initiation of OTG power delivery from battery 130 to load 800 has successfully completed. Power management circuitry 200 may take further additional action responsive to signal SSOK, including adjustment of the operation of voltage converter circuitry 825 as appropriate.

Figure 10:
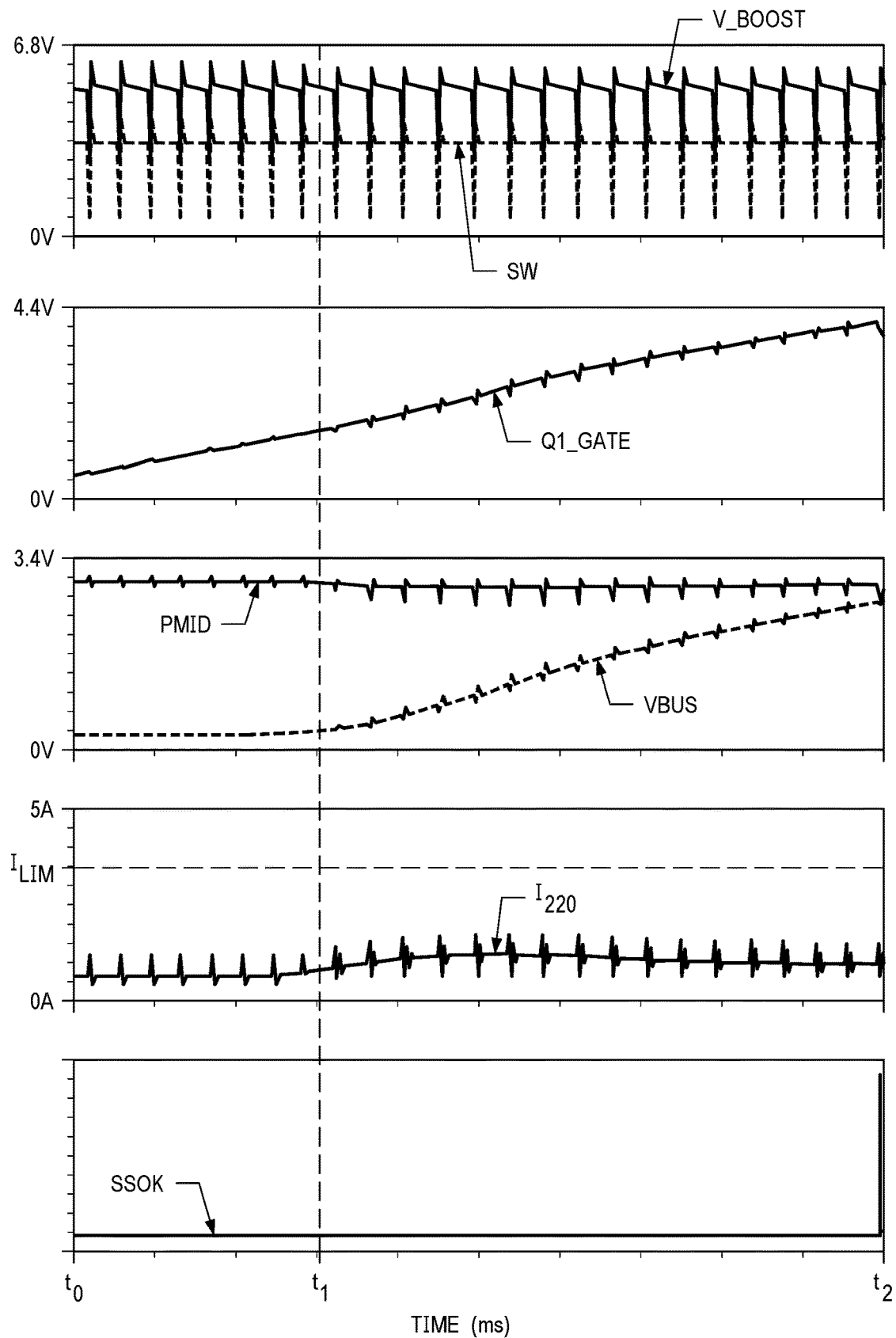
FIG. 10 is a timing diagram illustrating an example of transient response in the OTG operating mode of voltage converter circuitry of FIG. 8 under nominal startup conditions.

FIG. 10 is a timing diagram illustrating the transient response, based on circuit simulation, at certain nodes of voltage converter circuitry 825 during the initial start-up time in an OTG operating mode according to the example described above relative to FIG. 6 through FIG. 9. In the example of FIG. 10, the OTG operation begins at time $t_0$ at which the voltage at node PMID is about 3.0V and the voltage at power node VBUS is about 0V. Beginning from time $t_0$, voltage converter circuitry 825 operates as a boost converter, in which switching node SW periodically switches from about 0V to about the voltage at node PMID. Due to the action of bootstrap capacitor 150 responsive to this switching, boosted voltage V_BOOST follows the periodic switching at switching node SW, at a higher voltage (e.g., between about 4V to about 6V). A source-drain current $I_{220}$ is conducted by switching transistor 220 after time $t_0$, but remains below an overcurrent limit $I_{LIM}$, as detected by Schmitt trigger 830 from a differential voltage at its inputs.

As described above relative to FIG. 9, OTG switch circuit 620 initially begins driving the gate of blocking transistor 210 from node Q1_GATE with a relatively small current, as controlled by the slow turn-on of transistor 906 commencing after AND gate 915 turns on NFET 910. Beginning from time $t_0$, this small current begins raising the voltage at node Q1_GATE, and thus the gate-to-source voltage of blocking transistor 210. At about time $t_1$ shown in FIG. 10, the voltage at node Q1_GATE reaches a voltage that begins to turn on blocking transistor 210, allowing conduction from node PMID to power node VBUS, raising the output voltage at node VBUS as shown in FIG. 10. After time $t_1$, the voltage at node Q1_GATE at the gate of blocking transistor 210 continues to be driven higher over time as transistor 906 continues turning on. Accordingly, blocking transistor 210 is turned on more strongly after time $t_1$, raising the voltage at power node VBUS.

In the example of FIG. 10, load 800 at power node VBUS is not a short circuit, and as a result, the source-drain current $I_{220}$ conducted by switching transistor 220 remains below the overcurrent limit $I_{LIM}$ over this initial stage of the OTG operating mode. This operation continues to time $t_2$, at which the voltage at power node VBUS approaches the voltage at node PMID within a threshold of the voltage at node PMID as detected by Schmitt trigger 840. This condition corresponds to blocking transistor 210 being fully turned on by OTG switch circuit 620. In response, Schmitt trigger 840 issues a high logic level at its output as signal SSOK, indicating to power management circuitry 200 that the initiation of OTG power delivery from battery 130 to load 800 has successfully completed.

Figure 11:
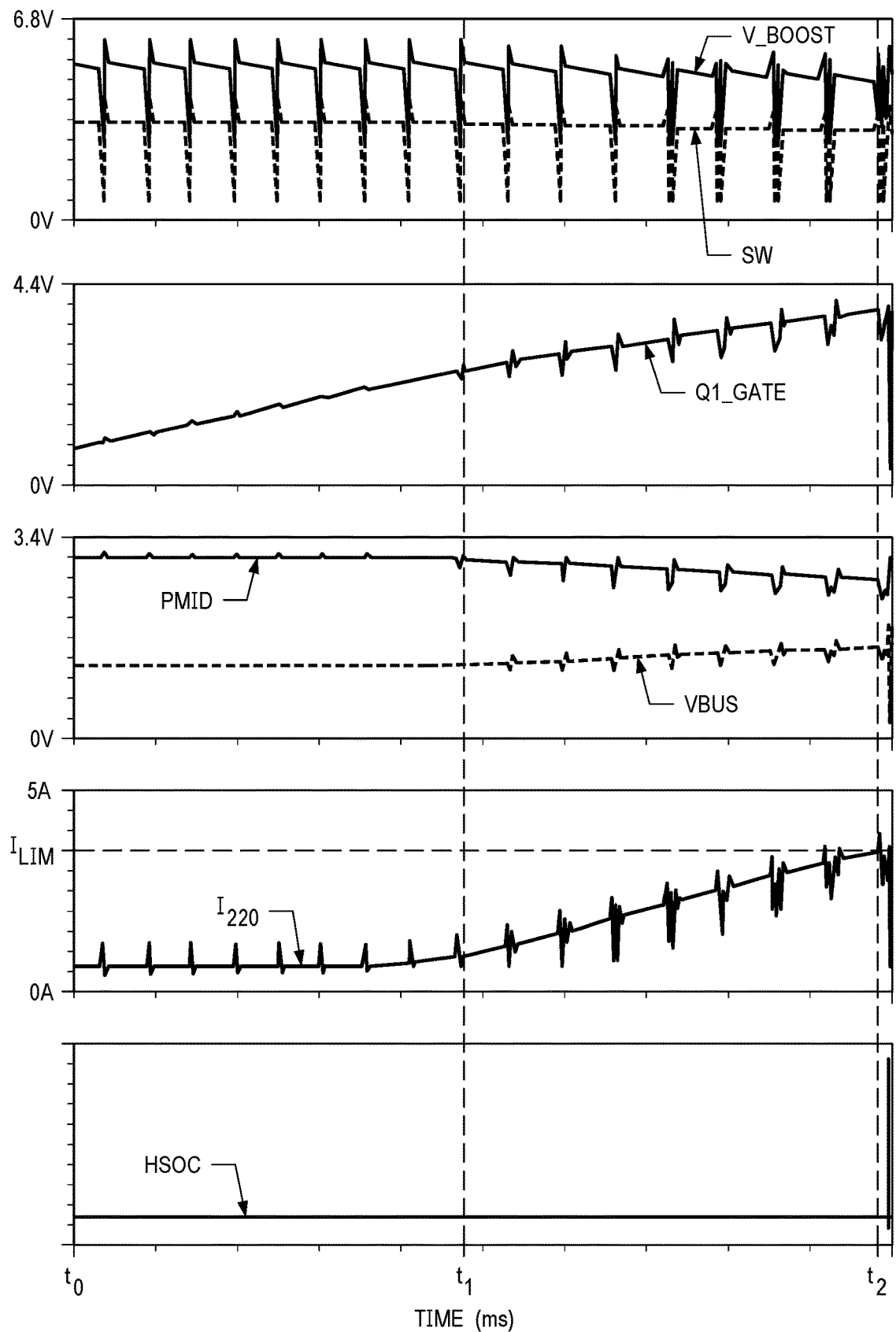
FIG. 11 is a timing diagram illustrating an example of transient response in the OTG operating mode of voltage converter circuitry of FIG. 8 under short circuit load conditions.

FIG. 11 is a similar timing diagram to that of FIG. 10, but illustrates the initial transient response, based on circuit simulation, of voltage converter circuitry 825 in the OTG operating mode in the case in which load 800 at power node VBUS exhibits a short circuit. As in the example of FIG. 10, the OTG operation shown in FIG. 11 begins from time $t_0$ with the switching of switching transistors 220 and 230, as evident by the periodic voltage behavior at switching node SW and of boosted voltage V_BOOST at bootstrap node BT. A source-drain current $I_{220}$ begins to be conducted through switching transistor 220 after initiation of the OTG operation at time $t_0$, and OTG switch circuit 620 initially begins driving the gate of blocking transistor 210 from node Q1_GATE with a relatively small current controlled by the slow turn-on of transistor 906, as described above. Responsive to the controlled drive current from OTG switch circuit 620, the voltage at node Q1_GATE begins rising. The voltage at node Q1_GATE reaches the threshold voltage of blocking transistor 210 at time $t_1$, allowing conduction from node PMID to power node VBUS, and continues to rise after time $t_1$ as transistor 906 fully turns on.

However, because of a short circuit at load 800 in the example of FIG. 11, the voltage at power node VBUS does not rise as blocking transistor 210 is turned on. Rather, the short circuit results in an increase in the current $I_{220}$ conducted by switching transistor 220. Current $I_{220}$ continues to increase as blocking transistor 210 is turned on more strongly by the rising voltage at node Q1_GATE, until time $t_2$ when current $I_{220}$ reaches current limit $I_{LIM}$ at Schmitt trigger 830. In response, Schmitt trigger 830 drives a logic high level at its output as overcurrent signal HSOC, which is communicated to power management circuitry 200. Power management circuitry 200 responds to overcurrent signal HSOC, such as by causing converter control circuitry 250 to disable gate drivers 260HS, 260LS and thus disable the switching of switching transistors 220, 230. Damage due to this overcurrent condition can thus be averted.

This alternative example implementation enables one or more advantages in the operation and control of a system power path manager for a mobile or other battery-powered electronic system. Initiation of an OTG operating mode operation according to this example is provided as a linear slow-start as the voltage converter is started, providing a smoother startup profile in which loads with high capacitance can be powered with lower initial current spikes. A wider range of output loads can thus be robustly served according to this example. Also, the simple configuration and open-loop operation of this example implementation enables its efficient realization in an integrated circuit, from the standpoint of die size.

Figure 7B:
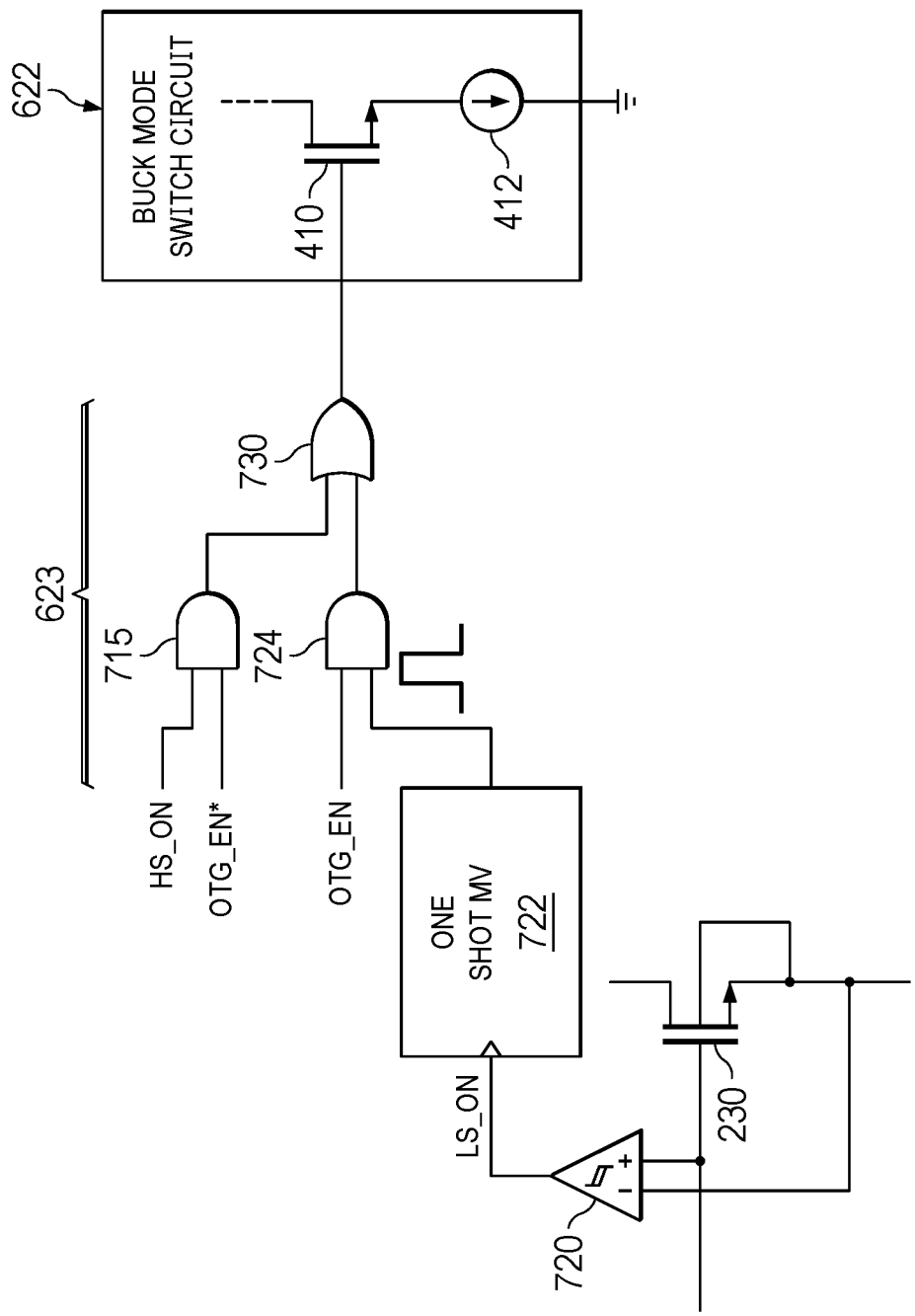
FIG. 7B is an electrical diagram, in schematic form, of an alternative example of logic circuitry enabling the OTG blocking transistor driver circuit of FIG. 8.

In some OTG applications in which the device being charged from battery 130 presents a very light load, voltage converter circuitry 225 may operate asynchronously in its boost mode. In such asynchronous operation, high side switching transistor 220 may never be turned on, and thus signal HS_ON may not be asserted during low load OTG operation. In the arrangement of FIG. 9, OTG switch circuit 620 would not be enabled (e.g., NFETs 910 and 920 will remain off) in this case. FIG. 7B illustrates the construction of logic circuitry 623 according to another example implementation, in which enable buck mode switch circuit 622 is enabled in this light load OTG situation.

In the implementation of FIG. 7B, Schmitt trigger 720 has its positive input coupled to the gate of low side switching transistor 230, and its negative input coupled to the source of low side switching transistor 230. The output of Schmitt trigger 720, which presents signal LS_ON, is coupled to the clock input of one-shot multivibrator 722. In this example, one-shot multivibrator 722 is arranged to generate a pulse at its output responsive to the falling edge of a signal received at this input, which in this case is signal LS_ON. The output of one-shot multivibrator 722 is coupled to one input of AND gate 724. AND gate 724 receives control signal OTG_EN at another input. The output of AND gate 724 is coupled to one input of OR gate 730, which receives the output of AND gate 715 at another input. AND gate 715 presents its output responsive to the logical AND of signal HS_ON and control signal OTG_EN*, as described above relative to FIG. 7A. The output of OR gate 730 is coupled to the gates of NFETs 710 and 720 in OTG switch circuit 620, which operates as described above relative to FIG. 7A.

In operation, OR gate 730 presents a high logic level at its output, turning on NFETs 710 and 720, responsive to AND gate 715 indicating that high side switching transistor 220 is on during buck mode operation, as described above relative to the arrangement of FIG. 7A. Also, the implementation of FIG. 7B also enables buck mode switch circuit 620 for asynchronous OTG operation in which high side switching transistor 220 is not turned on. In this example, Schmitt trigger 720 issues a high level of signal LS_ON while low side switching transistor 230 is turned on. Upon the falling edge of signal LS_ON, as low side switching transistor 230 is turned off, one-shot multivibrator 722 issues a positive pulse at its output, appearing at an input of AND gate 724. In OTG operation (control signal OTG_EN has a high logic level), AND gate 724 presents a high logic level at its output for the duration of the positive pulse from one-shot multivibrator 724. Through the action of OR gate 730, NFETs 710 and 720 are thus turned on for the duration of the positive pulse following the turning off of low side switching transistor 230.

In the boost mode operation of voltage converter circuitry 225 (FIG. 2), the on-state of low side switching transistor 230 builds up current in inductor 142. When low side switching transistor 230 turns off, this current is "pushed" through the body diode of high side switching transistor 220, which raises the voltage V_BOOST at bootstrap node BT above that at power node VBUS (or at converter node PMID). This boosted voltage V_BOOST can then be applied by OTG switch circuit 620 to refresh node Q1_GATE during the positive pulse from one-shot multivibrator 724 as low side switching transistor 230 is switched off.

Technical advantages that may be enabled by one or more of these aspects include an efficient implementation of a gate driver for the blocking transistor to reduce the voltage drop across the blocking transistor during operation of the voltage converter as a buck converter, or as a boost converter in an on-the-go (OTG) operating mode. Another technical advantage that may be enabled by an aspect is the ability to detect short circuit at a power terminal during an initial interval of the OTG operating mode.

As used herein, the terms "terminal," "node," "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

In this description, unless otherwise stated, "about," "approximately" or "substantially" preceding a parameter means being within +/−10 percent of that parameter.

In this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third-party. While, in some examples, certain elements are included in an integrated circuit and other elements are external to the integrated circuit, in other examples, additional or fewer features may be incorporated into the integrated circuit. Also, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are incorporated: (a) in/over a semiconductor substrate; (b) in a single semiconductor package; (c) in the same module; and/or (d) in/on the same printed circuit board.

Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in this description include a chassis ground, an Earth ground, a floating ground, a virtual ground, a digital ground, a common ground, and/or any other form of ground connection applicable to, or suitable for, the teachings of this description.

Modifications are possible in the described examples, and other examples are possible, within the scope of the claims.

What is claimed is:

1. A voltage converter comprising:
   a blocking transistor having a conduction path, a control terminal and a body diode, in which the conduction path of the blocking transistor is coupled between a power terminal and a converter terminal, and the body diode is configured to: conduct current from the power terminal to the converter terminal; and block current from the converter terminal to the power terminal;
   a first switching transistor having a conduction path and a control terminal, in which the conduction path of the first switching transistor is coupled between the converter terminal and a switching terminal;
   a second switching transistor having a conduction path and a control terminal, in which the conduction path of the second switching transistor is coupled between the switching terminal and a ground terminal;
   a first gate driver having an output and a bias input, in which the output of the first gate driver is coupled to the control terminal of the first switching transistor;
   a second gate driver having an output coupled to the control terminal of the second switching transistor; and
   a blocking transistor driver circuit having an output and a bootstrap terminal, in which the output of the blocking transistor driver circuit is coupled to the control terminal of the blocking transistor, and the bootstrap terminal is coupled to the bias input, wherein the blocking transistor driver circuit includes:
   a diode; and
   a switch circuit including a control terminal, in which the switch circuit is coupled in series with the diode between the bootstrap terminal and the control terminal of the blocking transistor, the control terminal of the switch circuit is coupled to the first switching transistor.

2. The voltage converter of claim 1, wherein: the switch circuit is configured to: close responsive to the first switching transistor having an on state; and open responsive to the first switching transistor having an off state.

3. The voltage converter of claim 2, wherein the switch circuit of the blocking transistor driver circuit comprises:
   a first leg comprising:
      a reference current source;
      a first transistor having a conduction path and a control terminal, in which the conduction path of the first transistor is coupled to the bootstrap terminal, and the control terminal of the first transistor is coupled to the conduction path;
      a second transistor having a conduction path and a control terminal, in which the conduction path of the second transistor is coupled in series with the conduction path of the first transistor between the bootstrap terminal and the reference current source, and the control terminal of the second transistor is coupled to the first switching transistor;
   a second leg comprising:
      a third transistor having a conduction path and a control terminal, in which the conduction path of the third transistor is coupled to the bootstrap terminal, and the control terminal of the third transistor is coupled to the control terminal of the first transistor;
   wherein the diode is coupled in series with the conduction path of the third transistor between the bootstrap terminal and the control terminal of the blocking transistor.

4. The voltage converter of claim 3, further comprising:
   a trigger circuit having an output and first and second inputs, in which the first input of the trigger circuit is coupled to a gate of the first switching transistor, the second input of the trigger circuit is coupled to a source of the first switching transistor, and the output of the trigger circuit is coupled to the control terminal of the second transistor.

5. The voltage converter of claim 1, wherein the blocking transistor driver circuit comprises:
   logic circuitry having an output and first and second inputs, in which the logic circuitry is configured to receive a mode signal at the first input, the second input is coupled to the first switching transistor, the output is coupled to the control terminal of the switch circuit, and the logic circuitry is configured to: apply a signal at the output to close the switch circuit responsive to the mode signal having a first state and the first switching transistor having an on state; and apply a signal at the output to open the switch circuit responsive to the first switching transistor having an off state or the mode signal having a second state.

6. The voltage converter of claim 5, wherein the mode signal in the first state indicates selection of a normal operating mode, the mode signal in the second state indicates selection of an on-the-go (OTG) operating mode, and the logic circuitry comprises:
first logic circuitry having an output and first and second inputs, in which the first logic circuitry is configured to receive the mode signal at the first input, the second input is coupled to the first switching transistor, and the first logic circuitry is configured to provide a signal having a first logic level at the output responsive to the mode signal having the first state while the first switching transistor has an on state;
second logic circuitry having an output and first and second inputs, in which the second logic circuitry is configured to receive the mode signal at the first input, the second input is coupled to the second switching transistor, and the second logic circuitry is configured to provide a pulse at the output responsive to the mode signal having the second state while the second switching transistor is turned off; and
an OR logic circuit having inputs and an output, in which the inputs are coupled to the outputs of the first and second logic circuitry, the output is coupled to the control terminal of the switch circuit, and the OR logic circuit is configured to apply a signal at the output to close the switch circuit responsive to either the first logic level at the output of the first logic circuitry or the pulse at the output of the second logic circuitry.

7. The voltage converter of claim 5, wherein:
the mode signal in the first state indicates selection of a normal operating mode and the mode signal in the second state indicates selection of an on-the-go (OTG) operating mode;
the switch circuit is a first switch circuit, and the logic circuitry is first logic circuitry; and
the voltage converter further comprises:
a second switch circuit having a control terminal, in which the second switch circuit is coupled in series with the diode between the bootstrap terminal and the control terminal of the blocking transistor;
second logic circuitry having an output and first and second inputs, in which the second logic circuitry is configured to receive the mode signal at the first input, the second input is coupled to the first switching transistor, the output is coupled to the control terminal of the second switch circuit, and the second logic circuitry is configured to: apply a signal at the output to close the second switch circuit responsive to the mode signal having the second state and the first switching transistor having an on state; and apply a signal at the output to open the second switch circuit responsive to the first switching transistor having an off state or the mode signal having the first state.

8. The voltage converter of claim 7, wherein the second switch circuit comprises:
a first leg comprising:
a first reference current source;
a first transistor having a conduction path and a control terminal, in which the conduction path of the first transistor is coupled to the bootstrap terminal, and the control terminal of the first transistor is coupled to the conduction path of the first transistor; and
a second transistor having a conduction path and a control terminal, in which the conduction path of the second transistor is coupled in series with the conduction path of the first transistor between the bootstrap terminal and the first reference current source, and the control terminal of the second transistor is coupled to the output of the second logic circuitry;
a second leg comprising:
a second reference current source;
a third transistor having a conduction path and a control terminal, in which the conduction path of the third transistor is coupled to the bootstrap terminal, and the control terminal of the third transistor is coupled to the conduction path of the third transistor; and
a fourth transistor having a conduction path and a control terminal, in which the conduction path of the fourth transistor is coupled in series with the conduction path of the third transistor between the bootstrap terminal and the second reference current source, and the control terminal of the fourth transistor is coupled to the output of the second logic circuitry;
a third leg comprising:
a fifth transistor having a conduction path and a control terminal, in which the conduction path of the fifth transistor is coupled to the bootstrap terminal, and the control terminal of the fifth transistor is coupled to the control terminal of the third transistor;
a sixth transistor having a conduction path and a control terminal, in which the conduction path of the sixth transistor is coupled in series with the conduction path of the fifth transistor, and the control terminal of the sixth transistor is coupled to the control terminal of the first transistor;
wherein the diode is coupled in series with the conduction path of the sixth transistor between the bootstrap terminal and the control terminal of the blocking transistor; and
the second logic circuitry is configured to: apply a signal at the output to turn on the second and fourth transistors responsive to the mode signal having the second state and the first switching transistor having an on state; and apply a signal at the output to turn off the second and fourth transistors responsive to the first switching transistor having an off state or the mode signal having the first state.

9. The voltage converter of claim 1, wherein the blocking transistor driver circuit comprises:
logic circuitry having an output and first and second inputs, in which the logic circuitry is configured to receive a mode signal at the first input, and the second input is coupled to the first switching transistor;
a first leg comprising:
a first reference current source;
a first transistor having a conduction path and a control terminal, in which the conduction path of the first transistor is coupled to the bootstrap terminal, and the control terminal of the first transistor is coupled to the conduction path of the first transistor; and
a second transistor having a conduction path and a control terminal, in which the conduction path of the second transistor is coupled in series with the conduction path of the first transistor between the bootstrap terminal and the first reference current source, and the control terminal of the second transistor is coupled to the output of the logic circuitry;

a second leg comprising:
- a second reference current source;
- a third transistor having a conduction path and a control terminal, in which the conduction path of the third transistor is coupled to the bootstrap terminal, and the control terminal of the third transistor is coupled to the conduction path of the third transistor; and
- a fourth transistor having a conduction path and a control terminal, in which the conduction path of the fourth transistor is coupled in series with the conduction path of the third transistor between the bootstrap terminal and the second reference current source, and the control terminal of the fourth transistor is coupled to the output of the logic circuitry;

a third leg comprising:
- a fifth transistor having a conduction path and a control terminal, in which the conduction path of the fifth transistor is coupled to the bootstrap terminal, and the control terminal of the fifth transistor is coupled to the control terminal of the third transistor;
- a sixth transistor having a conduction path and a control terminal, in which the conduction path of the sixth transistor is coupled in series with the conduction path of the fifth transistor, and the control terminal of the sixth transistor is coupled to the control terminal of the first transistor;

wherein the diode is coupled in series with the conduction path of the sixth transistor between the bootstrap terminal and the control terminal of the blocking transistor;

the logic circuitry is configured to: apply a signal at the output to turn on the second and fourth transistors responsive to the mode signal having a second state and the first switching transistor having an on state; and apply a signal at the output to turn off the second and fourth transistors responsive to the first switching transistor having an off state or the mode signal having a first state; and the second transistor has a slower turn-on characteristic than the fourth transistor.

10. The voltage converter of claim 9, further comprising:
an overcurrent trigger having an output and an input, in which the input is coupled to the conduction path of the first switching transistor, and the overcurrent trigger is configured to provide a signal indicating an overcurrent condition at the first switching transistor; and
controller circuitry having an input coupled to the output of the overcurrent trigger, in which the controller circuitry is configured to disable the first and second gate drivers from switching the first and second switching transistors responsive to the signal from the overcurrent trigger indicating the overcurrent condition.

11. The voltage converter of claim 1, wherein:
the blocking transistor is an n-channel field effect transistor (NFET) having a drain and a source, the drain is coupled to the converter terminal, and the source is coupled to the power terminal;
the first switching transistor is an NFET having a drain and a source, the drain is coupled to the converter terminal, and the source is coupled to the switching terminal; and
the body diode of the blocking transistor has an anode and a cathode, the anode is coupled to the power terminal, and the cathode is coupled to the converter terminal.

12. The voltage converter of claim 11, further comprising:
- a bootstrap diode having a cathode and an anode, in which the cathode is coupled to the bootstrap terminal, and the anode is coupled to a regulated voltage terminal; and
- a Zener diode having an anode and a cathode, in which the anode is coupled to the power terminal, and the cathode is coupled to the control terminal of the blocking transistor.

13. The voltage converter of claim 1, wherein the power terminal is a first power terminal, and the voltage converter further comprises:
- a battery transistor having a conduction path and a control terminal, in which the conduction path of the battery transistor is coupled between a second power terminal and a battery terminal; and
- a battery transistor control circuit coupled to the control terminal of the battery transistor.

14. Voltage converter circuitry, comprising:
- a blocking transistor having a conduction path, a control terminal and a body diode, in which the conduction path of the blocking transistor is coupled between a first power terminal and a converter terminal, and the body diode is configured to: conduct current from the first power terminal to the converter terminal; and block current from the converter terminal to the first power terminal;
- a first switching transistor having a conduction path and a control terminal, in which the conduction path of the first switching transistor is coupled between the first power terminal and a switching terminal;
- a second switching transistor having a conduction path and a control terminal, in which the conduction path of the second switching transistor is coupled between the switching terminal and a ground terminal;
- a passive network including a storage element, in which the passive network is coupled to the switching terminal and to a second power terminal;
- a first gate driver having an output and a bias input, in which the output of the first gate driver is coupled to the control terminal of the first switching transistor;
- a second gate driver having an output coupled to the control terminal of the second switching transistor;
- a blocking transistor driver circuit having an output and a bootstrap terminal, in which the output of the blocking transistor driver circuit is coupled to the control terminal of the blocking transistor, and the bootstrap terminal is coupled to the bias input, wherein the blocking transistor driver circuit includes:
  - a diode; and
  - a switch circuit having a control terminal, in which the switch circuit is coupled in series with the diode between the bootstrap terminal and the control terminal of the blocking transistor, the control terminal of the switch circuit is coupled to the first switching transistor; and
- a bootstrap capacitor coupled between the switching terminal and the bootstrap terminal.

15. The voltage converter circuitry of claim 14, wherein: the switch circuit is configured to: close responsive to the first switching transistor having an on state; and open responsive to the first switching transistor having an off state.

16. The voltage converter circuitry of claim 15, further comprising:
- a trigger circuit having an output and first and second inputs, in which the first input of the trigger circuit is coupled to a gate of the first switching transistor, and the second input of the trigger circuit is coupled to a source of the first switching transistor;
wherein the switch circuit of the blocking transistor driver circuit comprises:
a reference current source;
a first leg comprising:
a first transistor having a conduction path and a control terminal, in which the conduction path of the first transistor is coupled to the bootstrap terminal, and the control terminal of the first transistor is coupled to the conduction path;
a second transistor having a conduction path and a control terminal, in which the conduction path of the second transistor is coupled in series with the conduction path of the first transistor, and the control terminal of the second transistor is coupled to the output of the trigger circuit;
a second leg comprising:
a third transistor having a conduction path and a control terminal, in which the conduction path of the third transistor is coupled to the bootstrap terminal, and the control terminal of the third transistor is coupled to the control terminal of the first transistor;
wherein the diode is coupled in series with the conduction path of the third transistor between the bootstrap terminal and the control terminal of the blocking transistor.

17. The voltage converter circuitry of claim 14, further comprising:
a trigger circuit having an output and first and second inputs, in which the first input of the trigger circuit is coupled to the control terminal of the first switching transistor, and the second input of the trigger circuit is coupled to a source of the first switching transistor;
wherein the blocking transistor driver circuit comprises:
logic circuitry having an output and first and second inputs, in which the logic circuitry is configured to receive a mode signal at the first input, and the second input is coupled to the output of the trigger circuit;
a first leg comprising:
a first reference current source;
a first transistor having a conduction path and a control terminal, in which the conduction path of the first transistor is coupled to the bootstrap terminal, and the control terminal of the first transistor is coupled to the conduction path of the first transistor; and
a second transistor having a conduction path and a control terminal, in which the conduction path of the second transistor is coupled in series with the conduction path of the first transistor between the bootstrap terminal and the first reference current source, and the control terminal of the second transistor is coupled to the output of the logic circuitry;
a second leg comprising:
a second reference current source;
a third transistor having a conduction path and a control terminal, in which the conduction path of the third transistor is coupled to the bootstrap terminal, and the control terminal of the third transistor is coupled to the conduction path of the third transistor; and
a fourth transistor having a conduction path and a control terminal, in which the conduction path of the fourth transistor is coupled in series with the conduction path of the third transistor between the bootstrap terminal and the second reference current source, and the control terminal of the fourth transistor is coupled to the output of the logic circuitry;
a third leg comprising:
a fifth transistor having a conduction path and a control terminal, in which the conduction path of the fifth transistor is coupled to the bootstrap terminal, and the control terminal of the fifth transistor is coupled to the control terminal of the third transistor;
a sixth transistor having a conduction path and a control terminal, in which the conduction path of the sixth transistor is coupled in series with the conduction path of the fifth transistor, and the control terminal of the sixth transistor is coupled to the control terminal of the first transistor;
wherein the diode is coupled in series with the conduction path of the sixth transistor between the bootstrap terminal and the control terminal of the blocking transistor; and
the logic circuitry is configured to: apply a signal at the output to turn on the second and fourth transistors responsive to the mode signal having a second state and the first switching transistor having an on state; and apply a signal at the output to turn off the second and fourth transistors responsive to the first switching transistor having an off state or the mode signal having a first state.

18. The voltage converter circuitry of claim 17, further comprising:
an overcurrent trigger having an output and an input, in which the input is coupled to the conduction path of the first switching transistor, and the overcurrent trigger is configured to provide a signal indicating an overcurrent condition at the first switching transistor; and
controller circuitry having an input coupled to the output of the overcurrent trigger, in which the controller circuitry is configured to disable the first and second gate drivers from switching the first and second switching transistors responsive to the signal from the overcurrent trigger indicating the overcurrent condition.

19. The voltage converter circuitry of claim 14, wherein:
the blocking transistor is an n-channel field effect transistor (NFET) having a drain and a source, the drain is coupled to the converter terminal, and the source is coupled to the first power terminal;
the first switching transistor is an NFET having a drain and a source, the drain is coupled to the converter terminal, and the source is coupled to the switching terminal; and
the body diode of the blocking transistor has an anode and a cathode, the anode is coupled to the first power terminal, and the cathode is coupled to the converter terminal.

20. The voltage converter circuitry of claim 19, further comprising:
a bootstrap diode having a cathode and an anode, in which the cathode is coupled to the bootstrap terminal, and the anode is coupled to a regulated voltage terminal; and
a Zener diode having an anode and a cathode, in which the anode is coupled to the first power terminal, and the cathode is coupled to the control terminal of the blocking transistor.

21. The voltage converter circuitry of claim 14, further comprising:
   a battery transistor having a conduction path and a control terminal, in which the conduction path of the battery transistor is coupled between the second power terminal and a battery terminal; and
   a battery transistor control circuit coupled to the control terminal of the battery transistor.

22. The voltage converter circuitry of claim 14, wherein the storage element in the passive network comprises an inductor coupled between the switching terminal and the second power terminal.

23. A voltage converter comprising:
   a blocking transistor having a conduction path, a control terminal and a body diode, in which the conduction path of the blocking transistor is coupled between a first power terminal and a converter terminal, and the body diode is configured to: conduct current from the first power terminal to the converter terminal; and block current from the converter terminal to the first power terminal;
   a first switching transistor having a conduction path and a control terminal, in which the conduction path of the first switching transistor is coupled between the converter terminal and a switching terminal;
   a second switching transistor having a conduction path and a control terminal, in which the conduction path of the second switching transistor is coupled between the switching terminal and a ground terminal;
   a first gate driver having an output and a bias input, in which the output of the first gate driver is coupled to the control terminal of the first switching transistor;
   a second gate driver having an output coupled to the control terminal of the second switching transistor; and
   a blocking transistor driver circuit having an output and a bootstrap terminal, in which the output of the blocking transistor driver circuit is coupled to the control terminal of the blocking transistor, and the bootstrap terminal is coupled to the bias input, the blocking transistor driver circuit comprising:
      a diode;
      logic circuitry having an output and first and second inputs, in which the logic circuitry is configured to receive a mode signal at the first input, and the second input is coupled to the first switching transistor,
      a first leg comprising:
         a first reference current source;
         a first transistor having a conduction path and a control terminal, in which the conduction path of the first transistor is coupled to the bootstrap terminal, and the control terminal of the first transistor is coupled to the conduction path of the first transistor; and
         a second transistor having a conduction path and a control terminal, in which the conduction path of the second transistor is coupled in series with the conduction path of the first transistor between the bootstrap terminal and the first reference current source, and the control terminal of the second transistor is coupled to the output of the logic circuitry;
      a second leg comprising:
         a second reference current source;
         a third transistor having a conduction path and a control terminal, in which the conduction path of the third transistor is coupled to the bootstrap terminal, and the control terminal of the third transistor is coupled to the conduction path of the third transistor; and
         a fourth transistor having a conduction path and a control terminal, in which the conduction path of the fourth transistor is coupled in series with the conduction path of the third transistor between the bootstrap terminal and the second reference current source, and the control terminal of the fourth transistor is coupled to the output of the logic circuitry;
      a third leg comprising:
         a fifth transistor having a conduction path and a control terminal, in which the conduction path of the fifth transistor is coupled to the bootstrap terminal, and the control terminal of the fifth transistor is coupled to the control terminal of the third transistor;
         a sixth transistor having a conduction path and a control terminal, in which the conduction path of the sixth transistor is coupled in series with the conduction path of the fifth transistor, and the control terminal of the sixth transistor is coupled to the control terminal of the first transistor;
   wherein the diode is coupled in series with the conduction path of the sixth transistor between the bootstrap terminal and the control terminal of the blocking transistor; and
   the logic circuitry is configured to: apply a signal at the output to turn on the second and fourth transistors responsive to the mode signal having a first state and the first switching transistor having an on state; and apply a signal at the output to turn off the second and fourth transistors responsive to the first switching transistor having an off state or the mode signal having a second state.

24. The voltage converter of claim 23, further comprising:
   an overcurrent trigger having an output and an input, in which the input is coupled to the conduction path of the first switching transistor, and the overcurrent trigger is configured to provide a signal indicating an overcurrent condition at the first switching transistor; and
   controller circuitry having an input coupled to the output of the overcurrent trigger, in which the controller circuitry is configured to disable the first and second gate drivers from switching the first and second switching transistors responsive to the signal from the overcurrent trigger indicating the overcurrent condition.

25. The voltage converter of claim 23, further comprising a bootstrap capacitor coupled to the bootstrap terminal.

26. The voltage converter of claim 25, further comprising:
   a bootstrap diode having a cathode and an anode, in which the cathode is coupled to the bootstrap terminal, and the anode is coupled to a regulated voltage terminal; and
   a Zener diode having an anode and a cathode, in which the anode is coupled to the first power terminal, and the cathode is coupled to the control terminal of the blocking transistor.

27. The voltage converter of claim 23, wherein:
   the blocking transistor is an n-channel field effect transistor (NFET) having a drain and a source, the drain is coupled to the converter terminal, and the source is coupled to the first power terminal;
   the first switching transistor is an NFET having a drain and a source, the drain is coupled to the converter terminal, and the source is coupled to the switching terminal; and the body diode of the blocking transistor has an anode and a cathode, the anode is coupled to the first power terminal, and the cathode is coupled to the converter terminal.

28. The voltage converter of claim 23, further comprising:
a battery transistor having a conduction path and a control terminal, in which the conduction path of the battery transistor is coupled between a second power terminal and a battery terminal; and
a battery transistor control circuit coupled to the control terminal of the battery transistor.

* * * * *